(12) United States Patent
Ostrovsky et al.

(10) Patent No.: US 10,367,347 B2
(45) Date of Patent: Jul. 30, 2019

(54) ARC FAULT CIRCUIT INTERRUPTER

(71) Applicant: Leviton Manufacturing Company, Melville, NY (US)

(72) Inventors: Michael Ostrovsky, Brooklyn, NY (US); John Libretto, Massapequa, NY (US); Ronald Jansen, Ridgewood, NY (US); Michael Kamor, North Massapequa, NY (US); Adam Kevelos, Coram, NY (US)

(73) Assignee: Leviton Manufacturing Company, Inc., Melville, NY (US)

( * ) Notice: Subject to any disclaimer, the term of this patent is extended or adjusted under 35 U.S.C. 154(b) by 216 days.

(21) Appl. No.: 15/400,854

(22) Filed: Jan. 6, 2017

(65) Prior Publication Data

US 2017/0117699 A1    Apr. 27, 2017

Related U.S. Application Data

(60) Division of application No. 14/089,700, filed on Nov. 25, 2013, now Pat. No. 9,577,420, which is a continuation of application No. 13/194,723, filed on Jul. 29, 2011, now Pat. No. 8,599,523.

(51) Int. Cl.
*H02H 1/00* (2006.01)
*H02H 3/04* (2006.01)
*H02H 3/16* (2006.01)
*G01R 31/02* (2006.01)
*G08B 21/18* (2006.01)

(52) U.S. Cl.
CPC ............ *H02H 3/16* (2013.01); *G01R 31/025* (2013.01); *G08B 21/185* (2013.01); *H02H 1/0015* (2013.01); *H02H 3/044* (2013.01)

(58) Field of Classification Search
CPC ........ H02H 1/0015; H02H 3/044; H02H 3/16; G01R 31/025; G08B 21/185
USPC .......................................... 361/42
See application file for complete search history.

(56) References Cited

U.S. PATENT DOCUMENTS

| | | |
|---|---|---|
| 3,904,859 A | 9/1975 | Poncelet |
| 4,356,443 A | 10/1982 | Emery |
| 4,376,243 A | 3/1983 | Renn et al. |
| 4,466,071 A | 8/1984 | Russell, Jr. |
| 4,658,322 A | 4/1987 | Rivera |
| 4,851,782 A | 7/1989 | Jeerings et al. |
| 4,853,818 A | 8/1989 | Emery et al. |

(Continued)

OTHER PUBLICATIONS

"Tech. for Detecting and Monitoring Conditions that Could Cause Electrical Wiring System Fires," UL Underwriters Laboratories, Inc., Sep. 1995. cited by other.

(Continued)

*Primary Examiner* — Kevin J Comber
(74) *Attorney, Agent, or Firm* — Foley & Lardner LLP

(57) ABSTRACT

An arc fault circuit interrupter is disclosed. This arc fault circuit interrupter can include any one or more of three different sensors such as a high frequency sensor, and any one of lower frequency sensors such as a current sensor or a differential sensor. The arc fault circuit interrupter can be configured as an in line arc fault circuit interrupter installed in a wall box. In addition, the arc fault circuit interrupter can include a processor configured to determine any one of a series arc fault, or a parallel arc fault.

21 Claims, 18 Drawing Sheets

(56) References Cited

U.S. PATENT DOCUMENTS

| | | |
|---|---|---|
| 4,878,144 A | 10/1989 | Nebon |
| 4,931,894 A | 6/1990 | Legatti |
| 4,933,630 A | 6/1990 | Dupraz |
| 5,121,282 A | 6/1992 | White |
| 5,185,684 A | 2/1993 | Beihoff et al. |
| 5,185,686 A | 2/1993 | Hansen et al. |
| 5,206,596 A | 4/1993 | Beihoff et al. |
| 5,223,795 A | 6/1993 | Blades |
| 5,224,006 A | 6/1993 | MacKenzie et al. |
| 5,280,404 A | 1/1994 | Ragsdale |
| 5,432,455 A | 7/1995 | Blades |
| 5,434,509 A | 7/1995 | Blades |
| 5,459,630 A | 10/1995 | MacKenzie et al. |
| 5,519,561 A | 5/1996 | Mrenna et al. |
| 5,561,605 A | 10/1996 | Zuercher et al. |
| 5,590,012 A | 12/1996 | Dollar, II |
| 5,682,101 A | 10/1997 | Brooks et al. |
| 5,706,159 A | 1/1998 | Dollar et al. |
| 5,729,145 A | 3/1998 | Blades |
| 5,805,397 A | 9/1998 | MacKenzie |
| 5,805,398 A | 9/1998 | Rae |
| 5,815,352 A | 9/1998 | MacKenzie |
| 5,818,237 A | 10/1998 | Zuercher et al. |
| 5,818,671 A | 10/1998 | Seymour et al. |
| 5,825,598 A | 10/1998 | Dickens et al. |
| 5,834,940 A | 11/1998 | Brooks et al. |
| 5,835,321 A | 11/1998 | Elms et al. |
| 5,839,092 A | 11/1998 | Erger et al. |
| 5,847,913 A | 12/1998 | Turner et al. |
| 5,933,305 A | 8/1999 | Schmalz et al. |
| 5,940,256 A | 8/1999 | MacKenzie et al. |
| 5,946,179 A | 8/1999 | Fleege et al. |
| 5,963,406 A * | 10/1999 | Neiger .............. H02H 1/0015 361/42 |
| 5,982,596 A | 11/1999 | Spencer et al. |
| 5,986,860 A | 11/1999 | Scott |
| 6,057,997 A | 5/2000 | MacKenzie et al. |
| 6,088,205 A | 7/2000 | Neiger et al. |
| 6,128,169 A | 10/2000 | Neiger et al. |
| 6,191,589 B1 | 2/2001 | Clunn |
| 6,195,241 B1 | 2/2001 | Brooks et al. |
| 6,198,611 B1 | 3/2001 | Macbeth |
| 6,218,844 B1 | 4/2001 | Wong et al. |
| 6,226,161 B1 | 5/2001 | Neiger et al. |
| 6,246,556 B1 | 6/2001 | Haun et al. |
| 6,259,996 B1 | 7/2001 | Haun et al. |
| 6,266,219 B1 | 7/2001 | Macbeth et al. |
| 6,275,044 B1 | 8/2001 | Scott |
| 6,313,641 B1 | 11/2001 | Brooks |
| 6,339,525 B1 | 1/2002 | Neiger et al. |
| 6,362,628 B2 | 3/2002 | Macbeth et al. |
| 6,370,001 B1 * | 4/2002 | Macbeth .............. H02H 1/0015 324/424 |
| 6,373,257 B1 | 4/2002 | Macbeth et al. |
| 6,377,055 B1 | 4/2002 | Macbeth et al. |
| 6,388,849 B1 | 5/2002 | Rae |
| 6,407,893 B1 | 6/2002 | Neiger et al. |
| 6,417,671 B1 | 7/2002 | Tiemann |
| 6,421,214 B1 | 7/2002 | Packard et al. |
| 6,426,632 B1 | 7/2002 | Clunn |
| 6,426,634 B1 | 7/2002 | Clunn et al. |
| 6,433,977 B1 | 8/2002 | Macbeth |
| 6,433,978 B1 | 8/2002 | Neiger et al. |
| 6,504,692 B1 | 1/2003 | Macbeth et al. |
| 6,522,509 B1 | 2/2003 | Engel et al. |
| 6,538,862 B1 | 3/2003 | Mason et al. |
| 6,538,863 B1 | 3/2003 | Macbeth |
| 6,545,574 B1 | 4/2003 | Seymour et al. |
| 6,567,250 B1 | 5/2003 | Haun et al. |
| 6,570,392 B2 | 5/2003 | Macbeth et al. |
| 6,577,484 B1 | 6/2003 | Macbeth et al. |
| 6,608,741 B1 | 8/2003 | Macbeth |
| 6,621,388 B1 | 9/2003 | Macbeth |
| 6,628,487 B1 | 9/2003 | Macbeth |
| 6,633,467 B2 | 10/2003 | Macbeth et al. |
| 6,639,769 B2 | 10/2003 | Neiger et al. |
| 6,642,832 B2 | 11/2003 | Pellon et al. |
| 6,654,219 B1 | 11/2003 | Romano et al. |
| 6,707,651 B2 | 3/2004 | Elms et al. |
| 6,720,872 B1 | 4/2004 | Engel et al. |
| 6,731,483 B2 | 5/2004 | Mason et al. |
| 6,762,920 B2 | 7/2004 | Parker |
| 6,782,329 B2 | 8/2004 | Scott |
| 6,785,104 B2 | 8/2004 | Tallman et al. |
| 6,798,628 B1 | 9/2004 | Macbeth |
| 6,807,036 B2 | 10/2004 | Baldwin |
| 6,810,069 B2 | 10/2004 | Kojovic et al. |
| 6,839,208 B2 | 1/2005 | Macbeth et al. |
| 6,876,528 B2 | 4/2005 | Macbeth |
| 6,937,027 B2 | 8/2005 | Koo et al. |
| 6,943,558 B2 | 9/2005 | Hale et al. |
| 6,972,572 B2 | 12/2005 | Mernyk et al. |
| 6,972,937 B1 | 12/2005 | Macbeth et al. |
| 6,987,389 B1 | 1/2006 | Macbeth et al. |
| 6,999,289 B2 | 2/2006 | Macbeth et al. |
| 7,003,435 B2 | 2/2006 | Kolker et al. |
| 7,009,406 B2 | 3/2006 | Naidu et al. |
| 7,035,066 B2 | 4/2006 | McMahon et al. |
| 7,064,944 B2 | 6/2006 | Kim et al. |
| 7,068,045 B2 | 6/2006 | Zuercher et al. |
| 7,110,864 B2 | 9/2006 | Restrepo et al. |
| 7,161,775 B2 | 1/2007 | Schmalz |
| 7,180,299 B2 | 2/2007 | Mernyk et al. |
| 7,180,717 B2 | 2/2007 | Kojovic et al. |
| 7,190,562 B2 | 3/2007 | Pellon et al. |
| 7,215,520 B2 | 5/2007 | Elms et al. |
| 7,227,441 B2 | 6/2007 | Skendzic et al. |
| 7,253,603 B2 | 8/2007 | Kovanko et al. |
| 7,253,637 B2 | 8/2007 | Dvorak et al. |
| 7,253,640 B2 | 8/2007 | Engel et al. |
| 7,253,996 B2 | 8/2007 | Elms et al. |
| 7,259,568 B2 | 8/2007 | Mernyk et al. |
| 7,268,989 B2 | 9/2007 | Parker et al. |
| 7,298,598 B1 | 11/2007 | Morgan et al. |
| 7,304,829 B2 | 12/2007 | Nadipuram et al. |
| 7,307,820 B2 | 12/2007 | Henson et al. |
| 7,309,993 B2 | 12/2007 | Driehorn et al. |
| 7,319,574 B2 | 1/2008 | Engel |
| 7,321,227 B2 | 1/2008 | Fritsch et al. |
| 7,333,920 B2 | 2/2008 | Kolker et al. |
| 7,349,188 B2 | 3/2008 | Zuercher et al. |
| 7,359,168 B2 | 4/2008 | Elms et al. |
| 7,362,552 B2 | 4/2008 | Elms et al. |
| 7,368,918 B2 | 5/2008 | Henson et al. |
| 7,403,129 B2 | 7/2008 | Zhou et al. |
| 7,405,569 B2 | 7/2008 | Hagel et al. |
| 7,440,245 B2 | 10/2008 | Miller et al. |
| 7,440,250 B2 | 10/2008 | Terhorst |
| 7,441,173 B2 | 10/2008 | Restrepo et al. |
| 7,443,644 B2 | 10/2008 | Sung |
| 7,460,346 B2 | 12/2008 | Deshpande et al. |
| 7,463,037 B2 | 12/2008 | Henson et al. |
| 7,486,492 B2 | 2/2009 | Elms |
| 7,492,163 B2 | 2/2009 | Restrepo et al. |
| 7,492,562 B2 | 2/2009 | Evans et al. |
| 7,518,840 B2 | 4/2009 | Elms |
| 7,535,234 B2 | 5/2009 | Mernyk et al. |
| 7,558,033 B2 | 7/2009 | Zhou et al. |
| 7,570,465 B2 | 8/2009 | Beatty et al. |
| 7,633,729 B2 | 12/2009 | Oldenburg et al. |
| 7,864,492 B2 | 1/2011 | Restrepo et al. |
| 7,925,458 B2 | 4/2011 | Kolker et al. |
| 7,944,654 B2 | 5/2011 | Scott et al. |
| 7,986,148 B2 | 7/2011 | Mernyk et al. |
| 8,023,235 B2 | 9/2011 | Bilac et al. |
| 8,054,591 B2 | 11/2011 | Changali et al. |
| 8,054,592 B2 | 11/2011 | Rivers, Jr. |
| 2002/0008597 A1 | 1/2002 | Otsuka et al. |
| 2002/0033701 A1 | 3/2002 | Macbeth et al. |
| 2003/0072113 A1 | 4/2003 | Wong et al. |
| 2003/0074148 A1 | 4/2003 | Dvorak et al. |
| 2004/0100274 A1 | 5/2004 | Gloster et al. |
| 2005/0052809 A1 | 3/2005 | Evans et al. |
| 2005/0203672 A1 | 9/2005 | Restrepo et al. |

(56) References Cited

U.S. PATENT DOCUMENTS

| | | |
|---|---|---|
| 2005/0286184 A1 | 12/2005 | Campolo |
| 2005/0286185 A1 | 12/2005 | Henson et al. |
| 2006/0171085 A1 | 8/2006 | Keating |
| 2006/0227469 A1 | 10/2006 | Parker et al. |
| 2007/0091520 A1 | 4/2007 | Angelides et al. |
| 2007/0159738 A1 | 7/2007 | Natili et al. |
| 2007/0208520 A1 | 9/2007 | Zhang et al. |
| 2007/0208981 A1 | 9/2007 | Restrepo et al. |
| 2007/0210787 A1 | 9/2007 | Ebenezer et al. |
| 2007/0236208 A1 | 10/2007 | Kojovic et al. |
| 2007/0247767 A1 | 10/2007 | Zhang |
| 2007/0252603 A1 | 11/2007 | Restrepo et al. |
| 2007/0262780 A1 | 11/2007 | Mernyk et al. |
| 2007/0290695 A1 | 12/2007 | Mahon |
| 2008/0024140 A1 | 1/2008 | Henson et al. |
| 2008/0091308 A1 | 4/2008 | Henson et al. |
| 2008/0106254 A1 | 5/2008 | Kojovic |
| 2008/0106832 A1 | 5/2008 | Restrepo et al. |
| 2008/0140354 A1 | 6/2008 | Kolker et al. |
| 2008/0204949 A1 | 8/2008 | Zhou et al. |
| 2008/0204950 A1 | 8/2008 | Zhou et al. |
| 2008/0204955 A1 | 8/2008 | Parker et al. |
| 2009/0040666 A1* | 2/2009 | Elms .................. H02H 1/0015 361/42 |
| 2009/0198459 A1 | 8/2009 | Bilac et al. |
| 2009/0207535 A1 | 8/2009 | Mernyk et al. |
| 2009/0248329 A1 | 10/2009 | Restrepo |
| 2010/0060469 A1* | 3/2010 | Hetzmannseder .......................... G01R 31/3272 340/639 |
| 2010/0085206 A1 | 4/2010 | Nayak et al. |
| 2010/0149711 A1 | 6/2010 | Larson et al. |
| 2011/0181296 A1 | 7/2011 | Kolker et al. |

OTHER PUBLICATIONS

Earl W. Roberts, "Ideas-Ideas-Ideas," in IAEI Jan.-Feb. 2006, http://www.iaei.org/magazine/2006/01/ideas-ideas-ideas/.

* cited by examiner

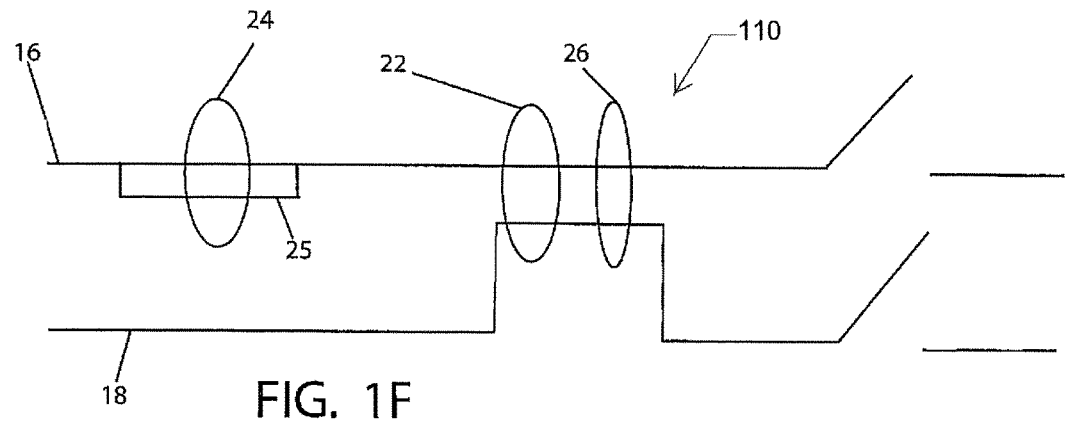
FIG. 1F
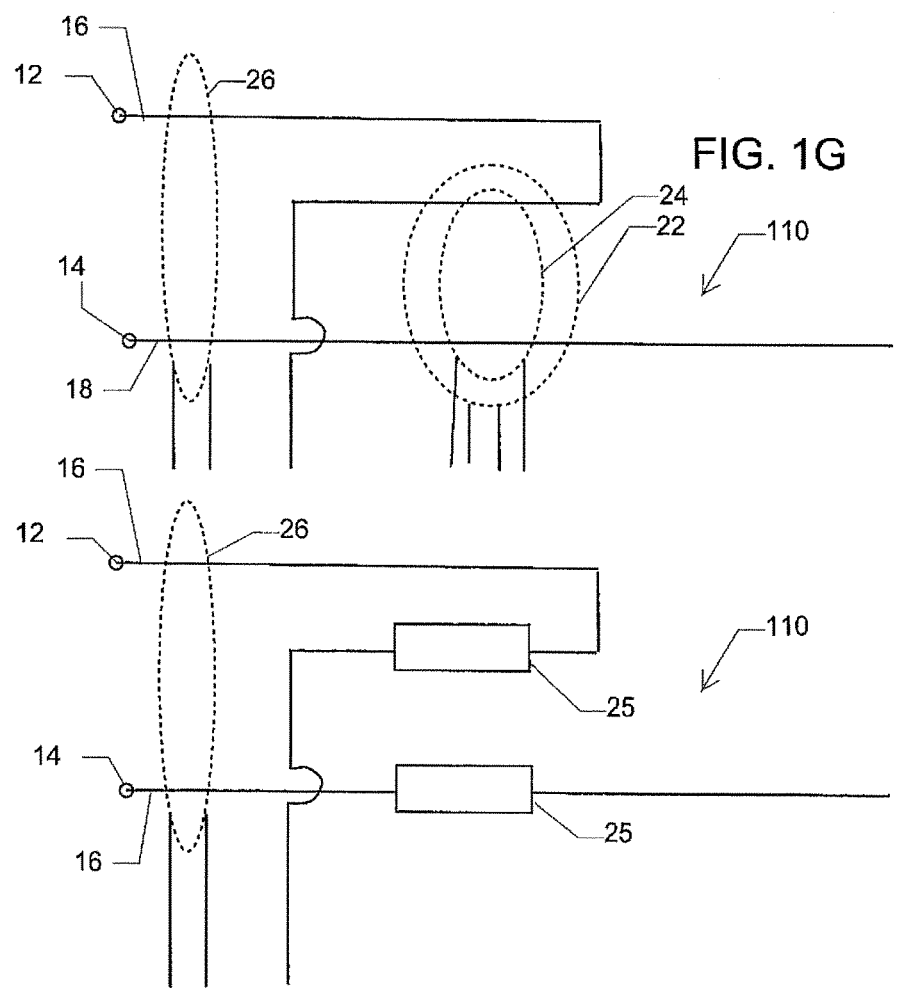
FIG. 1G
FIG. 1H

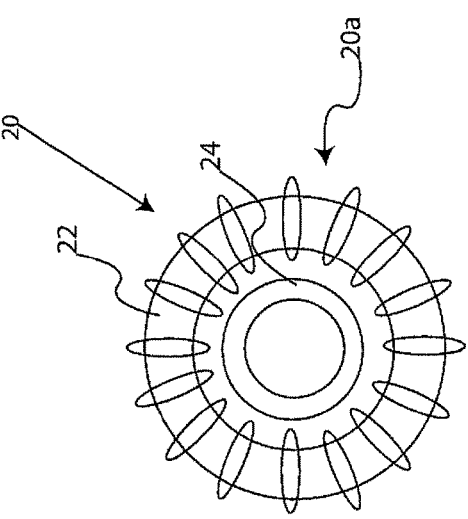
FIG. 2A  FIG. 2B  FIG. 2C
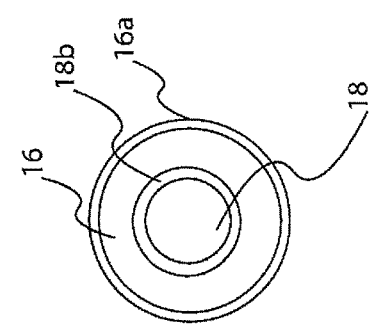
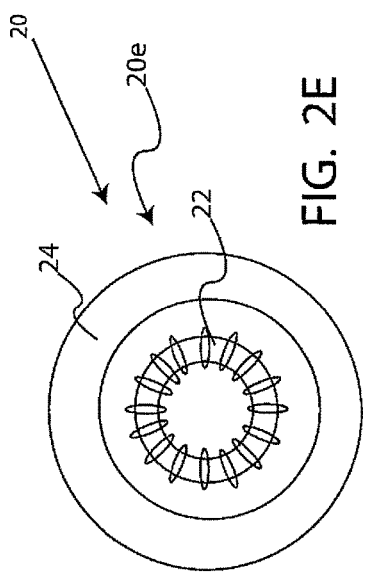
FIG. 2E
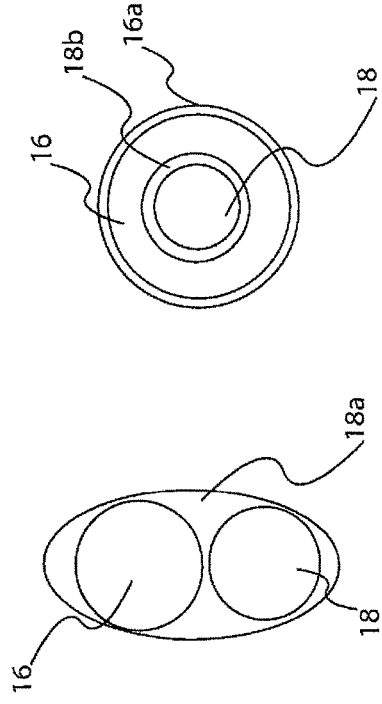
FIG. 2D
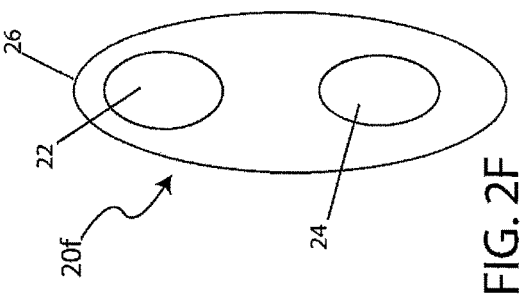
FIG. 2F

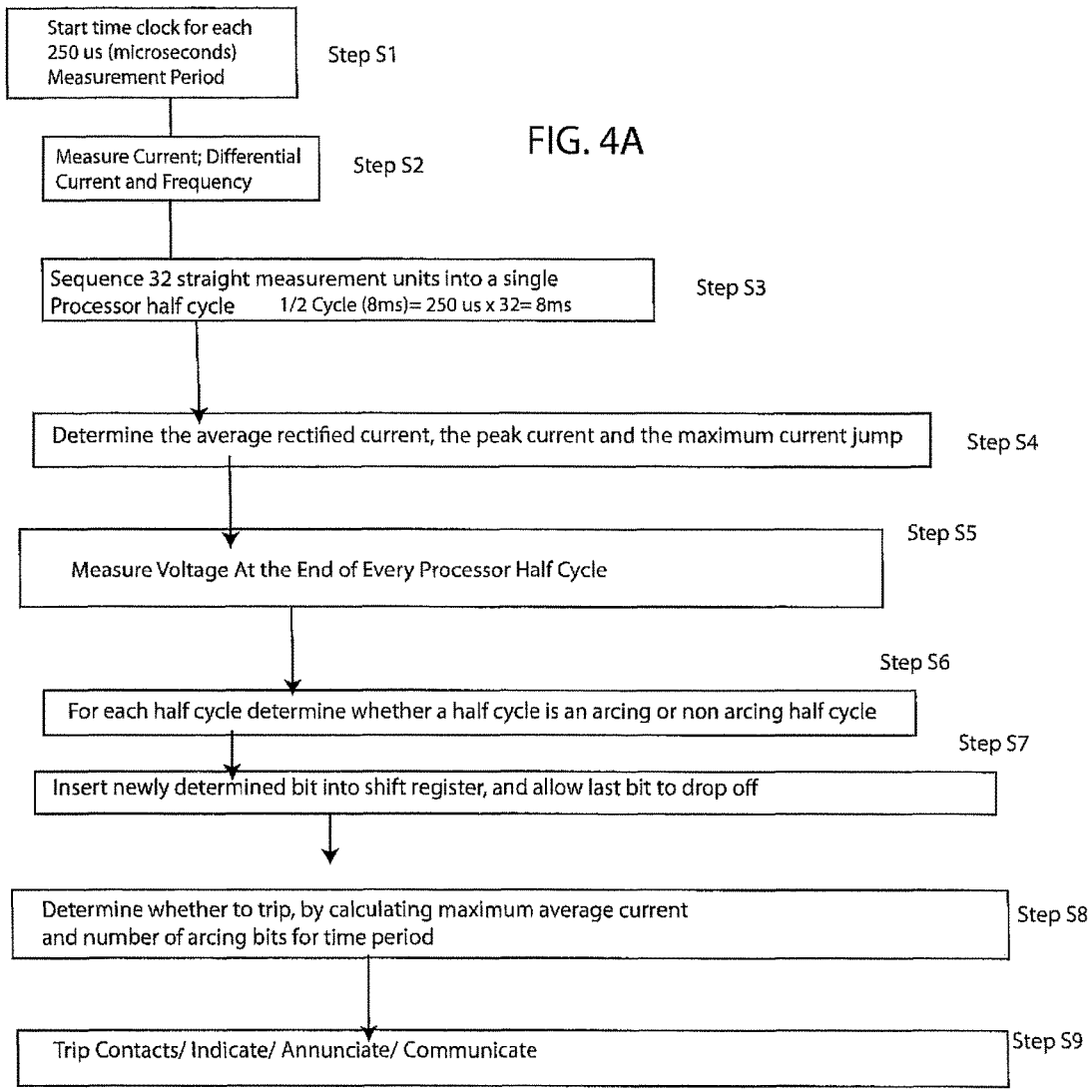

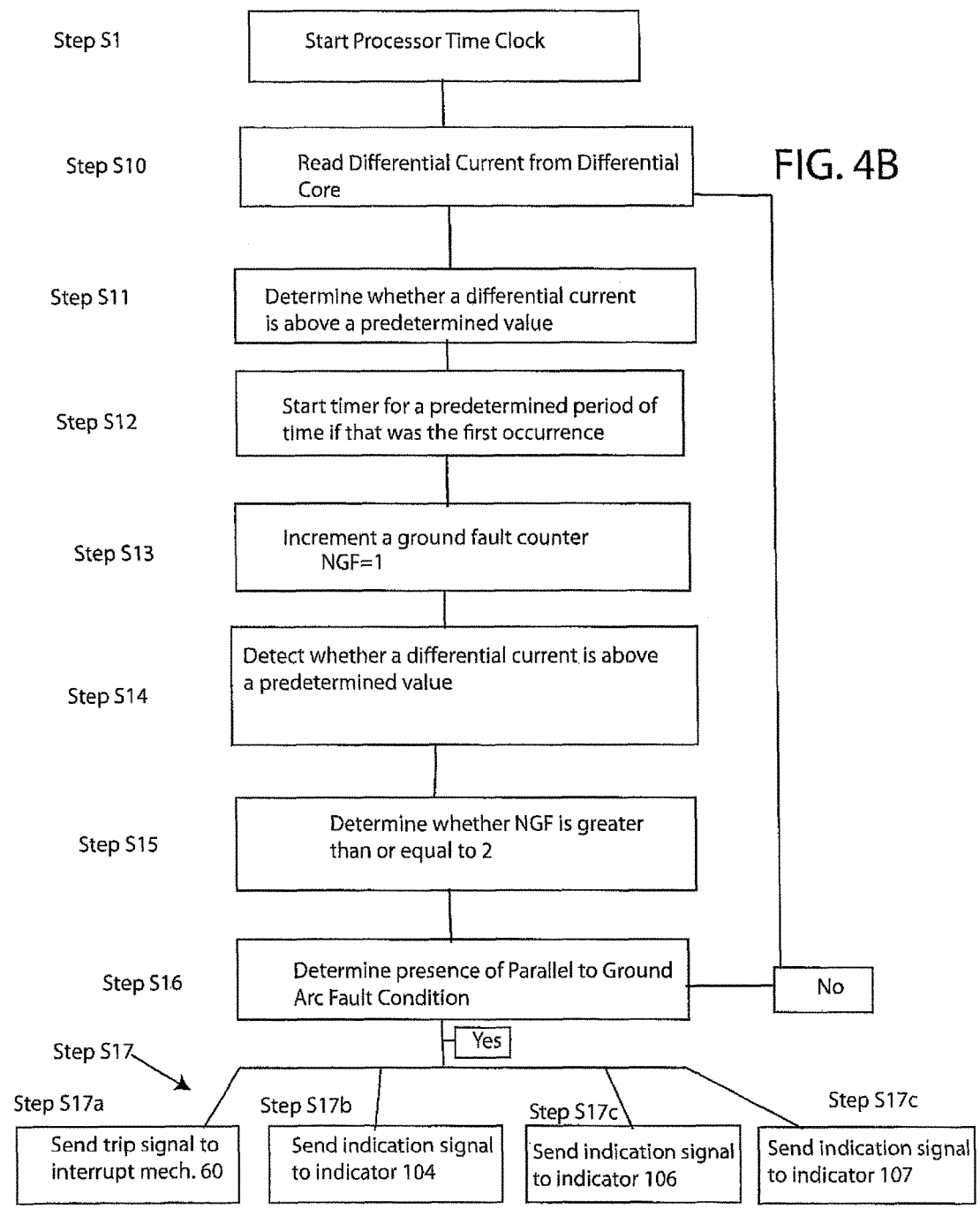

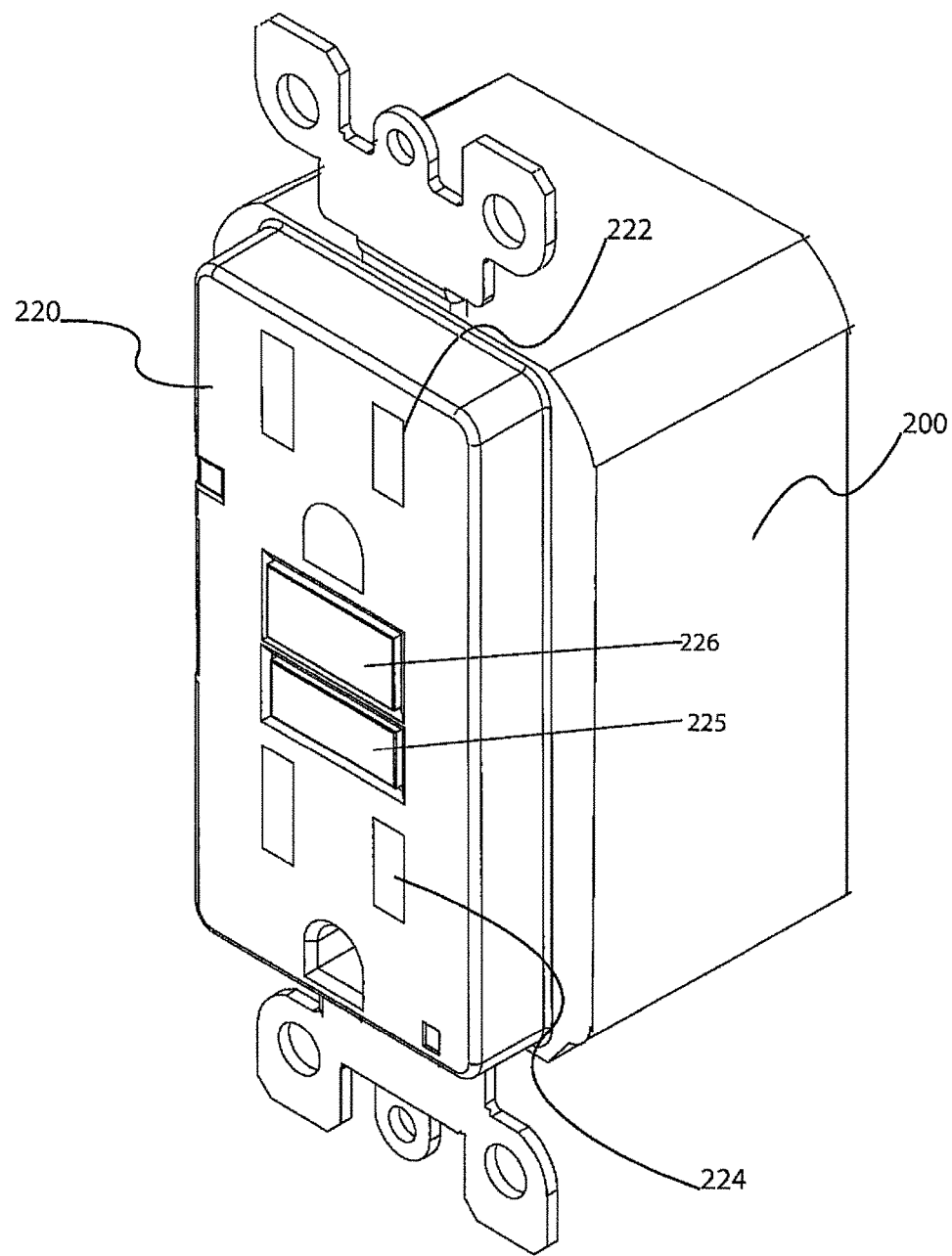

ARC FAULT CIRCUIT INTERRUPTER

The present patent application is a continuation of U.S. patent application Ser. No. 14/089,700 filed on Nov. 25, 2013, which is a continuation of U.S. patent application Ser. No. 13/194,723 filed on Jul. 29, 2011, the entire disclosures of which are hereby incorporated herein by reference in their entireties. The present patent application is related to commonly owned patent application filed on Jul. 29, 2011 having Ser. No. 13/194,386 entitled Circuit Interrupter with Improved Surge Suppression having the following inventors: Aleksandr Aronov, John LiBretto, and Michael Ostrovsky, the disclosure of which is hereby incorporated herein by reference in its entirety.

BACKGROUND OF THE INVENTION

Arc Fault Circuit Interrupter (AFCI) devices are configured to recognize arcing conditions in electrical wiring systems and interrupt current flow to extinguish arcing. At the same time, AFCI systems or devices need to be resistant to nuisance tripping, which may be caused by noise produced by electrical motors, switches, dimmers and other devices operating normally.

There are generally two types of arc faults, series arc faults and parallel arc faults. A series arc fault is in series with the load and thus cannot have a current value that is greater than the load current. Whereas, parallel arc faults may occur between any pairing of phase and neutral conductive paths, phase and ground conductive paths, or neutral and ground conductive paths. In contrast to series arc faults, the current value in parallel arc faults is not limited by the load and as a result, the current in parallel arc faults can potentially be much greater.

In the case of a parallel arc fault to ground, such an arc fault may be cleared either by a typical ground fault circuit interrupter (GFCI) or an AFCI.

Both series and parallel arc faults can serve as a source of ignition of surrounding combustible materials.

This application also incorporates by reference in their entirety the following U.S. patents: U.S. Pat. No. 7,986,148 which issued on Jul. 26, 2011 to Mernyk et al; U.S. Pat. No. 7,535,234 which issued on May 19, 2009 to Mernyk et al; U.S. Pat. No. 7,259,568 which issued on Aug. 21, 2007 to Mernyk et al; and U.S. Pat. No. 6,972,572 which issued on Dec. 6, 2005 to Mernyk et al.

SUMMARY

At least one embodiment can relate to a circuit interrupter device comprising a device current path comprising a phase conductive path having a line side and a load side, and a neutral conductive path having a line side and a load side.

There can be a differential sensor, communicatively arranged and configured to read a signal indicative of a current differential between the phase and neutral conductive paths and to output a signal. There can also be a high frequency sensor communicatively arranged and configured to read a signal indicative of a high frequency signal along one of the phase and neutral conductive paths and to output a high frequency signal. There can also be a current sensor communicatively arranged and configured to read a signal indicative of a current level along one of the phase and neutral conductive paths and to output a current level signal. There can also be a processor configured to receive the differential sensor signal, the high frequency signal, and the current level signal, wherein the processor is configured to carry out a set of instructions to detect the presence of a dangerous arc fault condition based on the signals.

Another embodiment includes at a minimum only a high frequency sensor, which is communicatively arranged and configured to read signals from both the phase current path and the neutral current path. Any one of the above embodiments can be configured to detect any one of a series arc fault or a parallel arc fault using a series of steps programmed onto a processor, and stored in a memory on the processor.

A process for determining a series arc can comprise any one of the following steps: setting a plurality of different time periods including setting a first time period and setting a second time period which is a fraction of the first time period; monitoring a plurality of electrical line characteristics, comprising at least frequency and current; comparing at least one of the plurality of electrical line characteristics to at least one predetermined value comprising counting a number of second time periods that a frequency is at, or between a first predetermined frequency range to find a first number, and counting a number of second time periods that a frequency is at or between a second predetermined frequency range to find a second number; and determining a presence of an arc by comparing the first number and the second number to at least one predetermined value.

A process for determining a parallel arc fault can comprise any one of the following steps:

starting a processor time clock for a series of first predetermined time periods; monitoring at least a current and frequency on a line; determining whether a peak current is greater than a predetermined value; determining the presence of arcing noise on a line based upon at least one predetermined frequency value for at least one predetermined time period; starting at least one counter to record the presence of at least one arcing characteristic for at least one time period of the series of first predetermined time periods within a second predetermined time period; and determining the presence of an arc based upon comparing a number provided by the at least one counter recording a presence of the at least one arcing characteristic for the first predetermined time period across the second predetermined time period to find a first number, and then comparing the first number to a predetermined value.

A process for determining a parallel arc fault to ground can include any one of the following steps:

starting a processor time clock for a series of predetermined time periods; reading a differential current from a differential core; determining whether the differential current is above a predetermined value; starting a timer for a predetermined period of time; recording for a first predetermined time period that the differential current is above a predetermined value; recording for a second predetermined time period that the differential current is above a predetermined value; and determining the presence of a parallel to ground arcing condition.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, reference characters which are the same denote similar elements throughout the several views:

FIGS. 1B through 1H are schematic layouts of wiring schemes that can each be used with any one of the embodiments of FIGS. 1A, 3A, 3B, 3C, and 3E;

FIG. 2A is a cross-sectional view of a conductive path comprising a line side phase and a line side neutral;

FIG. 2B is a cross-sectional view of a conductive path comprising a line side phase and a line side neutral with one conductive path being disposed concentric with respect to the other conductive path;

FIG. 2C is a plan view of a first configuration of sensors for use in any of the embodiments herein disclosed;

FIG. 2D is a transparent plan view of a second configuration of sensors for use in any of the embodiments herein disclosed;

FIG. 2E is a plan view of a third configuration of sensors for use in any of the embodiments herein disclosed;

FIG. 2F is a side cross-sectional view of an arrangement which includes a current sensor, a high frequency sensor, and a differential sensor;

FIG. 4A is a flow chart for the process for determining a series arc;

FIG. 4B is a flow chart for the process for determining a parallel to ground arc;

FIG. 7 is a front perspective view of a housing for an AFCI system.

DETAILED DESCRIPTION OF PREFERRED EMBODIMENTS

Figure 1A:
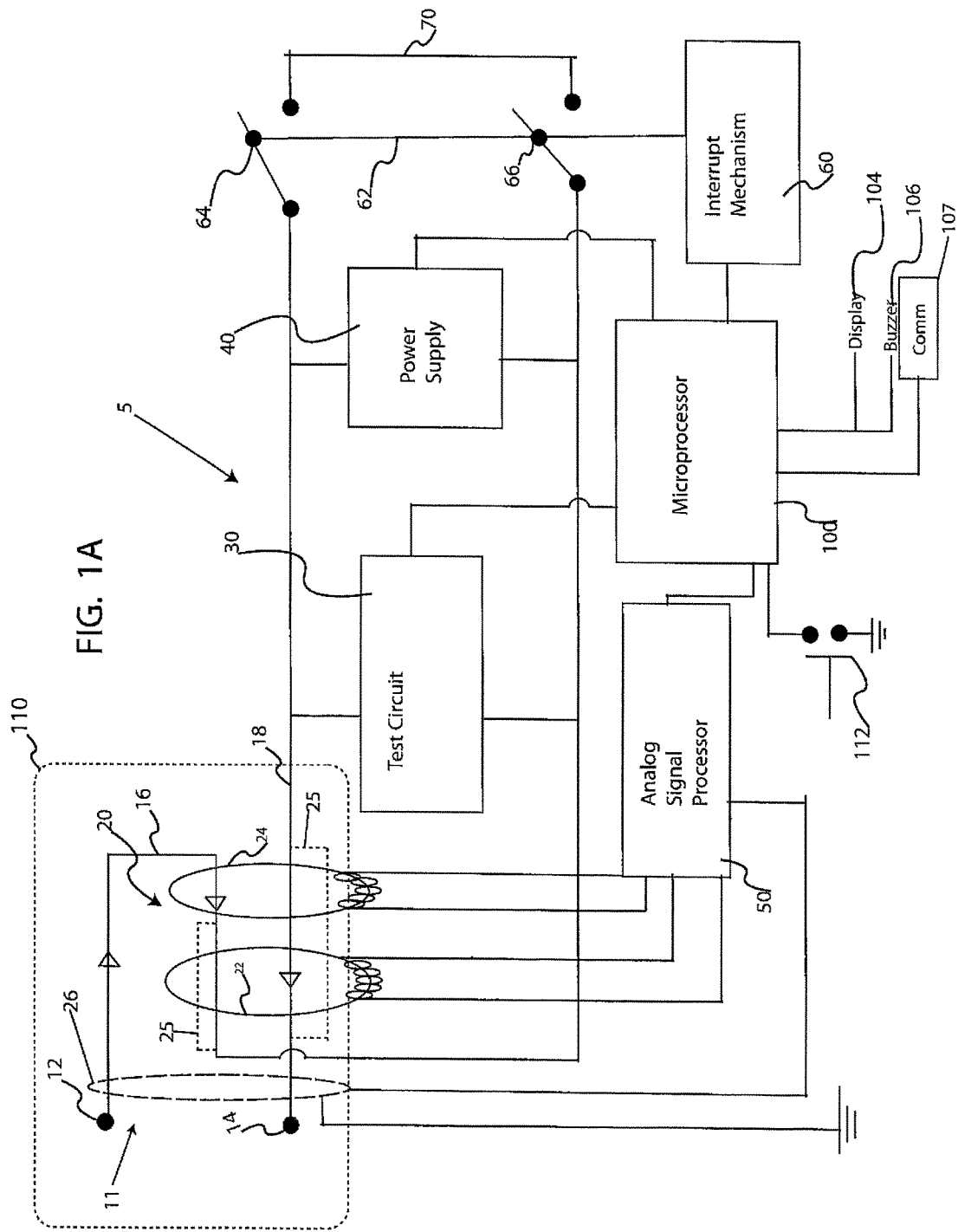
FIG. 1A is a block diagram of one embodiment of an AFCI system.

FIG. 1A depicts a block diagram for one embodiment of an arc fault circuit interrupter (AFCI) device 5. At least one embodiment of the invention relates to an AFCI system 5 which can be disposed inside of an enclosure such as a single-gang enclosure. The AFCI system 5 can include a current path comprising a phase conductive path having a line side and a load side, and a neutral conductive path having a line side and a load side.

FIG. 1A includes one embodiment of a wiring scheme layout 110. Alternatively, any wiring scheme layout depicted in FIGS. 1B-1H may be substituted in the wiring scheme layout 110 shown in FIG. 1A. Among other components, the wiring scheme layout can include, or be used with: a high frequency sensor 22, a power-line frequency/current sensor 24, and a differential current sensor 26 which can be a low frequency differential sensor. Generally, sensor 24, which may function as a current sensor, and differential sensor 26 operate at low frequencies, typically lower than high frequency sensor 22.

Any one of the three sensors can each be communicatively arranged and configured to read or measure electrical characteristics of a line or device conductive path such as a phase conductive path or a neutral conductive path. Some of these characteristics can include high frequency signals, current, and current differential on the device current path including one or more of the phase conductive paths and the neutral conductive paths. The term communicatively arranged and configured can result in the positioning of any one of the sensors in any one but not limited to the following configurations: adjacent to the device conductive path, electrically coupled to the device conductive path, magnetically coupled to the device conductive path, positioned such that the device conductive path passes through a core of the sensor.

For example, high frequency sensor 22 may be configured to read high frequency signals, particularly high frequency noise. Current sensor 24 may be configured to read a current value. Differential sensor 26 may be configured to read a current differential between, e.g., the phase and neutral conductive paths.

In FIG. 1A, the output from sensors 22, 24, and 26 are connected to circuit 50. Circuit 50 may be any suitable circuit such as but not limited to an analog signal processor (ASP). This analog signal processor circuit 50 can comprise any suitable circuit elements known in the art such as but not limited to amplifiers, rectifiers, comparators (or a combination thereof), or other elements to condition the signal from one or more of sensors 22, 24, and 26 before being input into processor 100. Alternatively, one or more of the output signals from sensors 22, 24, or 26 may be provided directly to processor 100 without any analog conditioning.

Processor 100 can be any suitable type of processor such as a microprocessor, microcontroller, ASIC, FPGA, or the like. It should also be noted that the term "processor" can be used interchangeably with microprocessor, microcontroller, ASIC, FPGA, or the like.

Processor 100 is configured or programmed to analyze output signals provided by one or more of sensors 22, 24, or 26 and determine if a predetermined dangerous condition exists; e.g., an arc fault, ground fault, or the like. If processor 100 detects a predetermined condition, the processor 100 may be configured or programmed to trigger interrupting mechanism 60 to interrupt power to one or more of the phase and neutral conductive paths, thus disconnecting power to load 70.

Figure 3A:
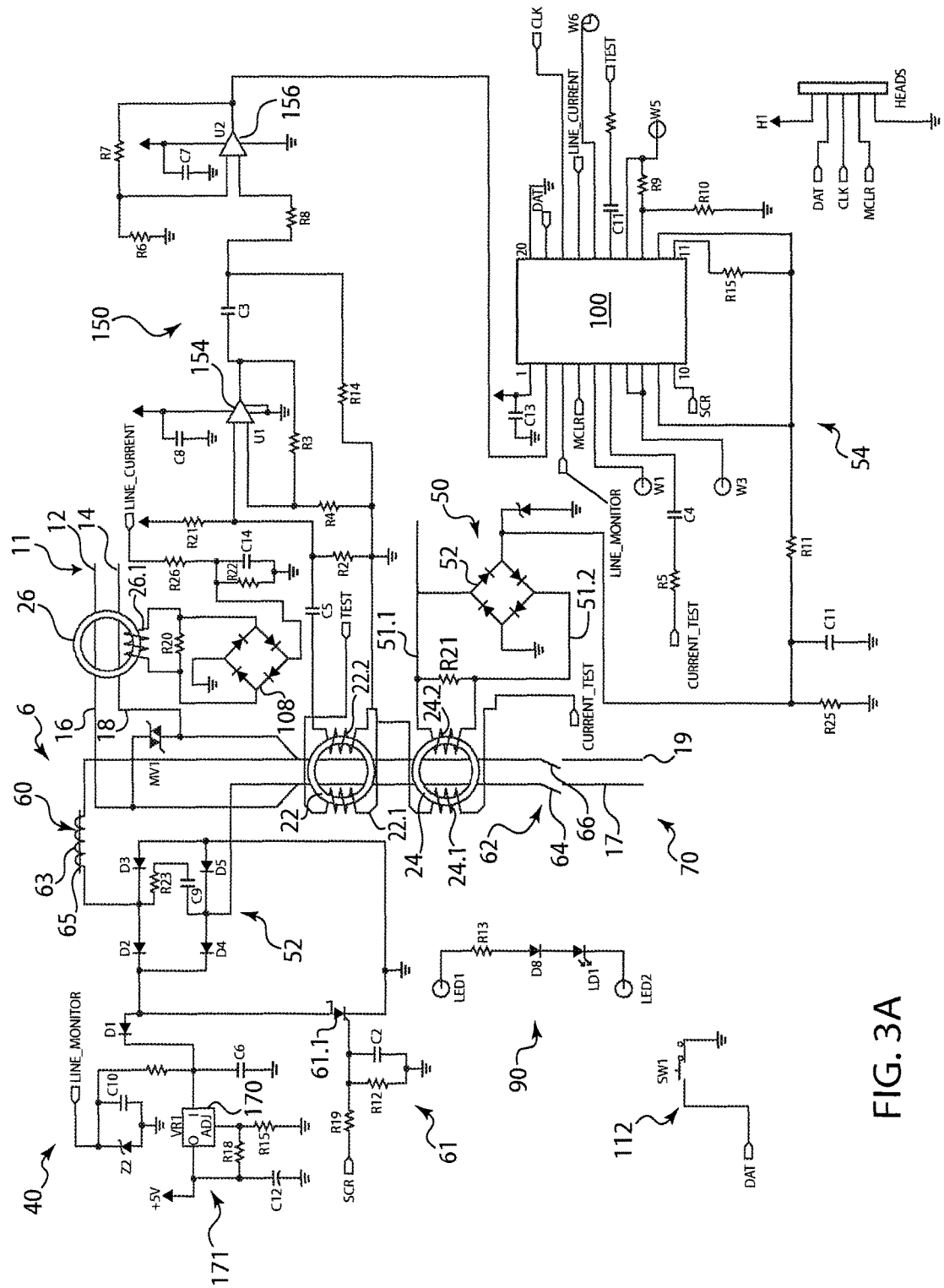
FIG. 3A is a circuit diagram of an embodiment of an AFCI system.
Figure 3B:
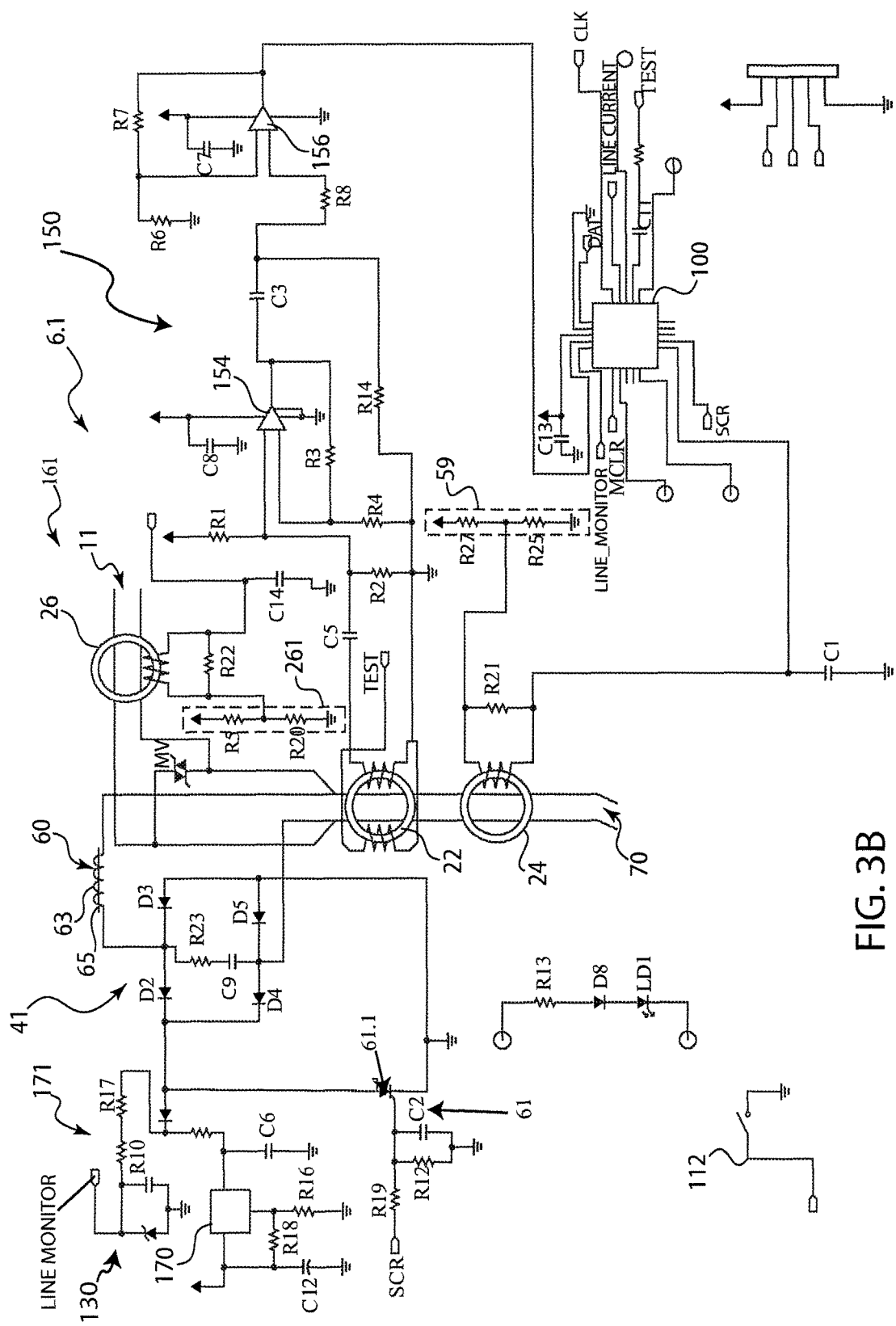
FIG. 3B is a circuit diagram of another embodiment of an AFCI system.
Figure 3C:
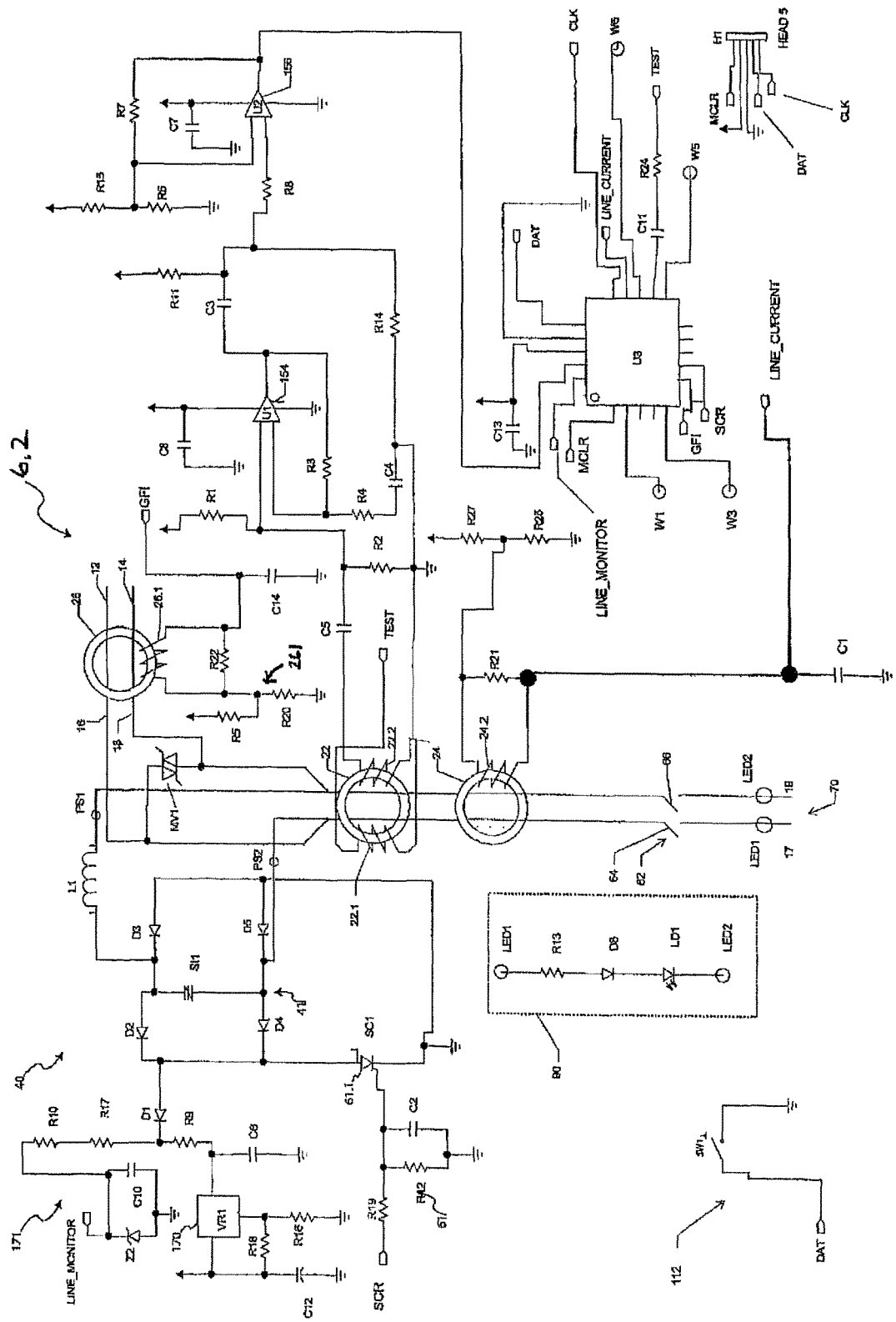
FIG. 3C is a circuit diagram of another embodiment of an AFCI system.
Figure 3D:
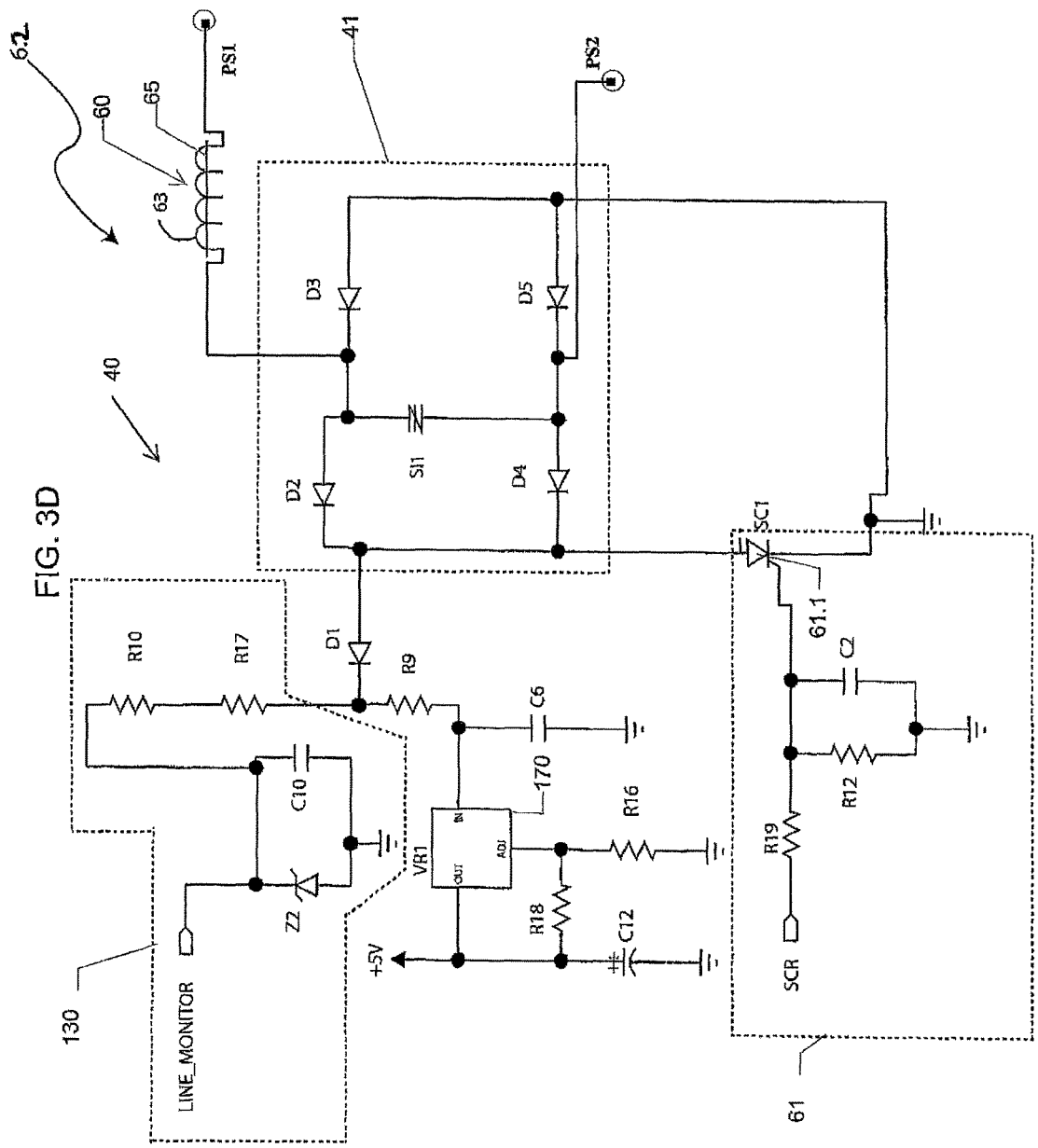
FIGS. 3D through 3F are detailed views of portions of FIG. 3C.
Figure 3E:
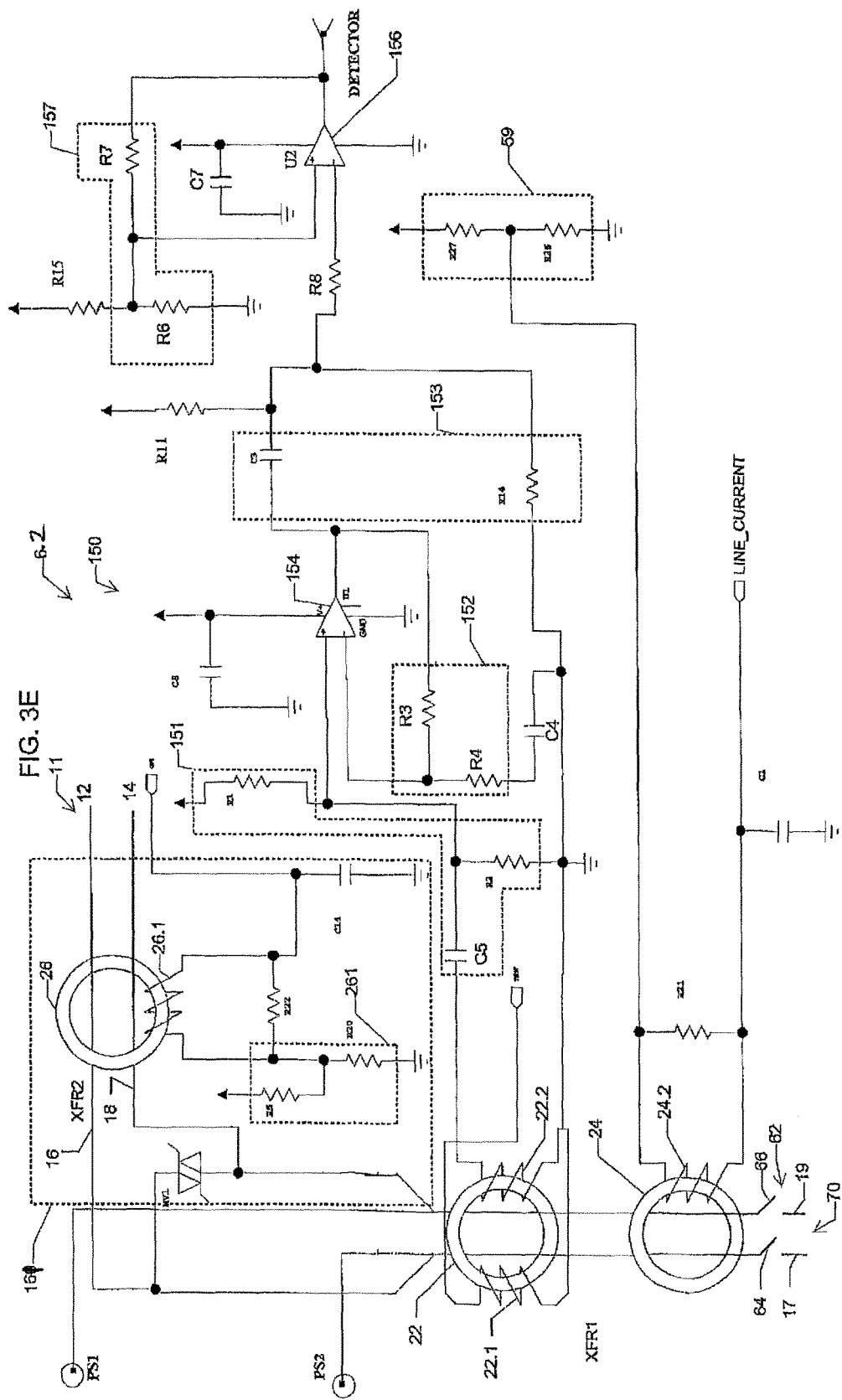

One or more sensors are preferably coupled to signal processing elements, e.g., signal processor 150 shown in FIGS. 3C and 3E. In the embodiments shown in FIGS. 3C and 3E, the signal processing elements that form analog/signal processor 150 generally comprise the circuitry disposed between the various sensors (high frequency sensor 22, current sensor 24, and differential sensor 26) and processor 100.

The signal processing configurations of sensors 26, 24 and 22 will now be discussed. It should be understood that the signal processor 150 can be implemented with any suitable components. High frequency sensor 22 is preferably adapted and configured to sense arcing signals within a frequency range that is preferably above 1 MHz but below 10 MHz, e.g., between 2-10 MHz. The sensitivity level and frequency range for high frequency sensor 22 is preferably governed/set by signal processing circuitry 150. In one embodiment, signal processing circuitry 150 preferably includes a plurality of different sub-circuits 151, 152, 153, 154, 156 and 157. Circuit 151 is a first high pass filter comprising resistors R1, R2 and capacitor C5. Circuit 151 is coupled to an output of sensor 22.2. In addition, set gain circuit 152, which comprises resistors R3 and R4, is employed to set to the gain for amplifier 154. Coupled to the output of amplifier 154 is a second high pass filter circuit 153 comprising resistor R14 and capacitor C3. High pass filter circuit 153 is also coupled to the input of amplifier/comparator 156. Amplifier/comparator 156 includes an analog input and is configured to provide a digital output into the DETECTOR input pin of processor 100 (pin P19 in FIG. 3F). Also coupled to the input of comparator 156 is a hysteresis circuit 157, comprising resistors R6 and R7. As shown, the comparator 156 is configured to produce a square wave signal and hysteresis circuit 157 may advantageously be employed to remove noise from the output signal to processor 100. Preferably, hysteresis circuit 157 may also be used to set the arc detection sensitivity.

A test button may be arranged and configured to actuate a test switch 112. Opening or closing test switch 112 will cause a change in a signal, denoted as signal DAT, which is fed to an input of processor 100. Processor 100 may be configured or programmed to energize test circuit 30 to initiate a test sequence on the device when test switch 112 is closed (alternatively, the test sequence can be initiated when test switch 112 is opened). When test circuit 30 is energized (e.g.—receives a signal from processor 100), test circuit 30 is adapted and configured to inject a test signal into the device circuitry to determine if the system, or components thereof, such as the sensors 20, is/are properly functioning.

The test signal inserted into the system (such as the sensors 20), results in a simulated fault reading on the sensors 20. This simulated fault reading is sent through analog signal processor 50 to processor 100. The processor 100 could be configured to use this signal to determine the health of the system; e.g., if processor 100 reads the simulated fault signal within a pre-determined period of time after the test sequence is initiated, the processor may be programmed to conclude that the test was successful. Otherwise, the processor may be programmed to conclude that the test should be considered a failure, indicating a non-operative system or malfunctioning components.

In addition, while the test sequence described above was initiated manually by a user activating test switch 112, in certain preferred embodiments, the test may be automatically initiated by processor 100 if processor 100 is configured or programmed as such. In this case, the test sequence may be referred to as an automatic self-test.

In certain preferred embodiments, the AFCI circuitry, e.g., the circuits shown in 6, 6.1, or 6.2, are adapted and configured to be tested. As previously noted, testing can be implemented either on an automatic or scheduled basis controlled by the processor 100 on a periodic or scheduled basis, and/or manually by a user, e.g., via a manual input such as a manual test or reset button 112. Preferably, when user actuatable test button 112 is pressed, a test sequence is activated, either by processor 100 or by a dedicated IC (e.g., GFCI chip). In one embodiment where the processor 100 would initiate the test after receiving an input from a user or automatically according to some schedule, at the start of the test sequence, processor 100 could be configured to generate a high frequency square wave signal on TEST connection (pin P12 in FIG. 3F). This high frequency square wave signal is transmitted/passes through capacitor C11 and resistor R1, and ultimately is applied to the winding 22.1 of high frequency sensor 22. Winding 22.1 on high frequency sensor 22 has relatively fewer turns than winding 22.2 (e.g., 10 turns). Preferably, the high frequency square wave signal simulates an arc fault as seen/detected by the AFCI device/circuitry. Thereafter, if processor 100 senses the simulated arc fault correctly, i.e., if processor 100 detects a signal on pin 19 as a result of the AFCI circuitry performing properly, the test can be considered successful indicating all components are within operational limits. In one preferred embodiment and in conjunction with a mechanical reset lockout feature, processor 100 triggers SCR 61.1 and resets the circuit. In a further embodiment employing a reset lockout configuration, manual button 112 can only activate a test sequence if contacts 62 and 64 are tripped.

In addition to the contacts tripping or failing to reset, there can be other indicators of failed manual/automatic self-tests or actual arc faults. For example, an indicator circuit may be employed. One possible configuration for an indicator circuit 90 is shown in FIG. 3C. This circuit comprises resistor R13, diode D8, and LD1. These components of indicator circuit 90 may all be arranged in series and electrically coupled to processor 100 so as to indicate the state of the AFCI circuit. This type of indicator circuit 90 is similar to display indicator circuit 104 or audible indicator circuit 106, shown in FIG. 1A.

In addition, processor 100 can be coupled to one or more indicators and/or communication circuitry 107. For example, a visual indicator 104 and/or an audio indicator 106 can be provided. The indicators 104 and 106 can be any suitable type of indicators such as a LED, light, neon, buzzer, or piezoelectric element. If communication circuitry 107 is provided, the communication circuitry can include a transceiver and can have optional addressable circuitry used to communicate the status of the device or communicate with other devices on a network. Alternately, communication circuitry 107 can be used to communicate any suitable data to any suitable device or even be used to receive remote instructions (e.g., receive instructions to perform a self-test, receive instructions to "trip" (interrupt the circuit), receive instructions to "reset", etc.).

It should be understood by a person of ordinary skill in the art that the individual blocks represented in FIG. 1A do not necessarily represent individual components. Rather any suitable combination of these blocks may be implemented by a single component such as, but not limited to, a microprocessor, integrated circuit, or the like. Similarly, any given block may be implemented by more than one circuit component without departing from the spirit of the invention.

As shown in FIGS. 6 and 7, the AFCI system 5 can be sized and arranged to be disposed within a housing 200, the housing being configured to be installed in a single gang electrical enclosure, e.g., a wall-box mounted AFCI. In other embodiments, the AFCI system may be housed or mounted in any suitable form factor such as, but not limited to, a circuit breaker, a panel mount device, an in-line device, or the like.

Figure 3F:
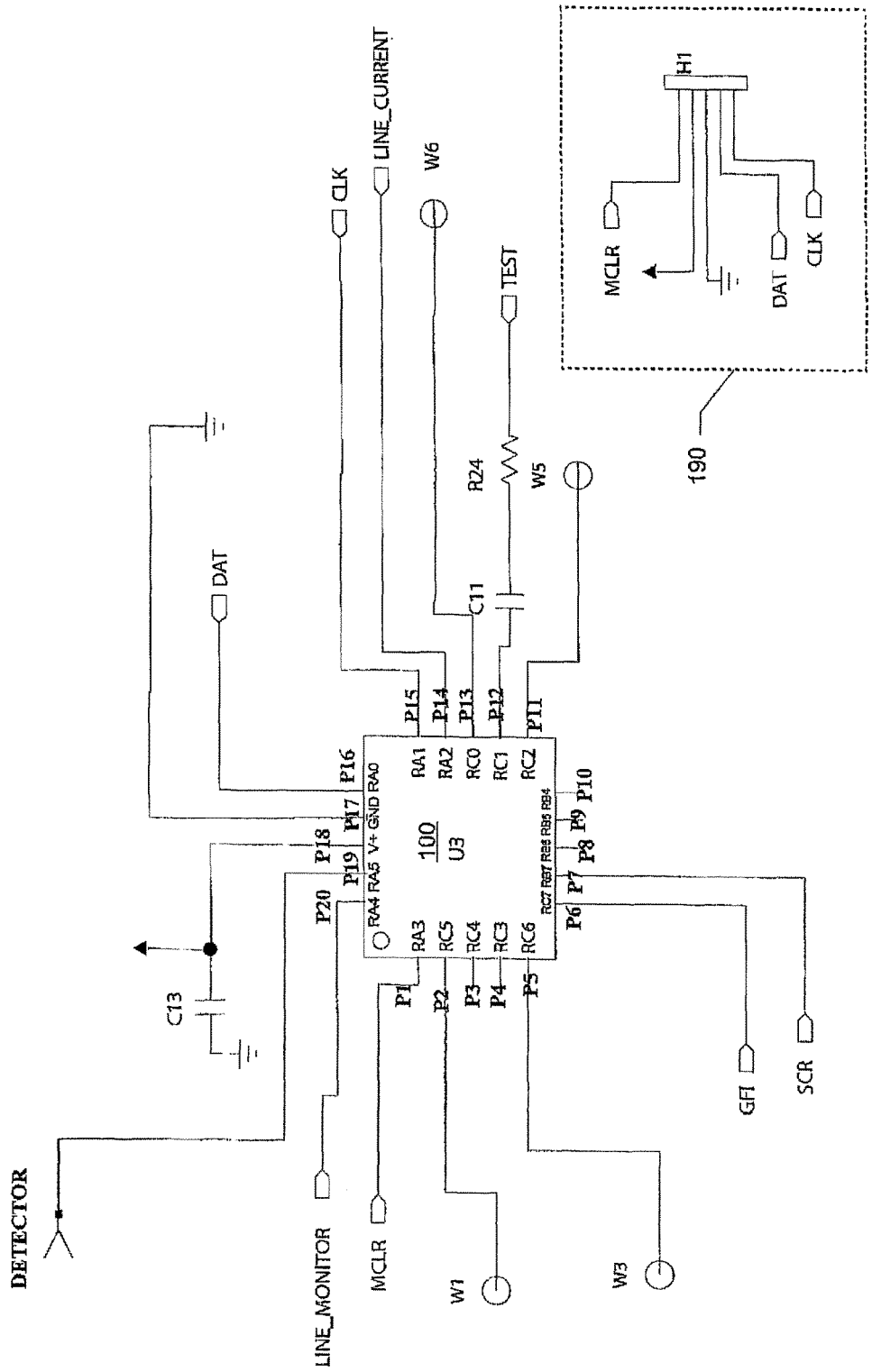

Alternative embodiments of an AFCI system 6, 6.1 and 6.2 are shown in FIGS. 3A, 3B, and 3C. FIGS. 3D, 3E, and 3F are more detailed views of the components in the embodiment in FIG. 3C. Any of these embodiments of the AFCI system may employ any one of the wiring configurations shown in FIGS. 1B-1F, or any one of the sensor configurations shown in FIGS. 2C-2F.

As illustrated in FIG. 1A, device 5 includes line side connections 11 and load side connections 70. Line side connections 11 include a first line contact 12 and a second line contact 14. First line contact 12 is coupled to first conductive path 16 (i.e., a line side phase conductive path), while second line contact 14 is coupled to second conductive path 18 (i.e., a line side neutral conductive path). Contacts 12, 14 can be in the form of terminal screws, wire leads, or other connections known in the art that can be coupled to a power line. First conductive path 16 and second conductive path 18 form a circuit and in the embodiment shown in FIG. 1A, the first conductive path 16 is arranged to conduct current in the same direction as the second conductive path 18 relative to the sensors 22 and 24. Sensor 20 which can be any one of sensors 22, and 24 may be any suitable sensor known in the art, and may include a single sensor or two or more sensors. In this exemplified embodiment, sensor 20 includes two sensors 22 and 24, wherein one sensor is a high frequency sensor and the other sensor is a low frequency/power line sensor. It should be understood that, although in this embodiment both are depicted (as well as in the embodiments of FIGS. 1B-1H), it is not required to have both a high frequency sensor and a low frequency/power line sensor.

Load side 70 may be separated from line input conductive paths 11 by separable contacts 62, which include separable contacts 64 and 66. Load side 70 includes a first load side conductive path 17, which can be a load side phase line, and a second load side conductive path 19, which can be a load side neutral line. Contact 64 is configured to separate first line side conductive path 16 from first load side conductive path 17 and contact 66 is configured to separate second line side conductive path 18 from second load side conductive path 19.

High frequency sensor 22 may be in the form of any high frequency sensor known in the art. In at least one embodiment, the high frequency sensor 22 may be a transformer having a coil wound around an air core (e.g.—a Rogowski coil) or a high permeability magnetic core (e.g., an iron powder core where powdered iron is encapsulated in an epoxy substrate). It should be noted that the term "air core" may refer to any core where the core is non-ferrous, e.g., plastic or any suitable material. Low frequency/power line sensor 24 can be in the form of any low frequency sensor known in the art. In at least one embodiment, the low frequency sensor 24 may be a typical current sensor or current transformer.

In addition, in other alternative embodiments, a differential current sensor 26 may be used to detect arc faults to ground. Accordingly, in this view, differential sensor 26 is shown in dashed lines to indicate that it may be optionally used or not used in certain embodiments. This differential sensor 26 may also be employed in the embodiments shown in FIGS. 1B-1H, 3A, 3B, 3C, and 3E. While sensors 20, 22, 24 and 26 are shown in the drawings, the claims are not to be construed as requiring any one of the above listed sensors 20, 22, 24, 26 unless as expressed in writing in those claims.

The high frequency sensor 22, the low frequency sensor 24, and the optional differential sensor 26 are preferably arranged and configured to detect different signals, or conditions, on conductive paths 16 and 18. In at least one embodiment, the low frequency sensor 24 has a high permeability iron powder core. This allows for the core to be manufactured with a relatively small size while avoiding saturation with a wide range of input signals. For example, one type of transformer core (produced by Micrometals, Inc.) is a current transformer core which is close to a standard T50-45 and Al parameter (44.0 nH/(N*N)), although any other suitable type of transformer can be used as well.

Advantageously, with both a low frequency sensor 24 and a high frequency sensor 22, arc faults can be detected with greater precision and/or reliability. Preferably, each sensor is configured to detect arc faults in the pre-determined frequency range. For example, the low frequency sensor 24 may be configured to detect electrical characteristics of a current path which may be indicative of arc faults at the predetermined frequency range of, preferably a power line frequency or in another embodiment at a higher frequency e.g., 0-2 MHz or 0-4 MHz. The high frequency sensor 22 is preferably configured to detect electrical characteristics of a current path which may be indicative of arc faults at a predetermined frequency range higher than the low frequency sensor, e.g. greater than a predetermined frequency that is in at least one embodiment higher than power line frequency, such as greater than or equal to 1 MHz, alternatively greater than or equal to 2 MHz or greater than or equal to 4 MHz. In certain preferred embodiments, the range for the high frequency sensor 22 may be 1-10, MHz, alternatively, 2-10 MHz, and in other embodiments the range for the high frequency sensor may be 4-10 MHz.

In alternative embodiments, the addition of an optional differential sensor 26 to supplement/complement the high frequency sensor 22 and low frequency sensor 24, creates a system where parallel arc faults to ground can also be detected by measuring the differential current between the phase and neutral conductive paths.

In yet another alternative embodiment, a shunt 25 (see FIGS. 1F and 1H) may be employed. The shunt 25 preferably has a known resistance along its path and can be incorporated into the phase conductive path 16, the neutral conductive path 18, or both, such that the current flowing can be determined by the voltage across the shunt.

As discussed, an arc fault in one or more conductive paths can be detected/sensed by different sensors; e.g., low frequency sensor 24, high frequency sensor 22, differential sensor 26, and/or a combination thereof. These sensors may be arranged and configured to detect arcing in one or more line conductive paths 16 and 18 as well as load conductive paths 17 and 19.

In one preferred embodiment, high frequency sensor 22 may be configured with a toroidal core having an outside diameter of 0.5 inches, an inner diameter of 0.303 inches, a height of 0.190 inches, and 44.0 nanohenries per turn squared. The effective magnetic dimensions of such a sensor with a core made of high permeability iron powder would be: a length of 3.19 cm, an area of 0.112 square centimeters, and a volume of 0.358 cubic centimeters. An example of such a sensor is available from Micrometals Inc. utilizing a powder core T50-45/0.110 with 750 turns of #38 A.W.G. wire. Alternatively, the high frequency sensor core may utilize any suitable material, or combination of materials, including but not limited to ferrite, air, polymer, or high permeability magnetic material.

Preferably, the high frequency sensor 22 is configured such that when no arcing is present, it does not generate an output. When arcing is present, the high frequency sensor is configured to output a signal indicative of arcing as a result of high frequency components on the conductive path(s).

It should be readily appreciated by those skilled in the art that when referring to AC current, direction of current flow reverses with a certain frequency/period, e.g., sixty times a second in a standard 60 Hz system. In the discussion herein, the AC current is described as flowing in a certain direction. When the "direction" of current flow is referred to, it is intended to reflect the "conventional current flow" of the AC circuit as known in the electrical arts.

Figure 1B:
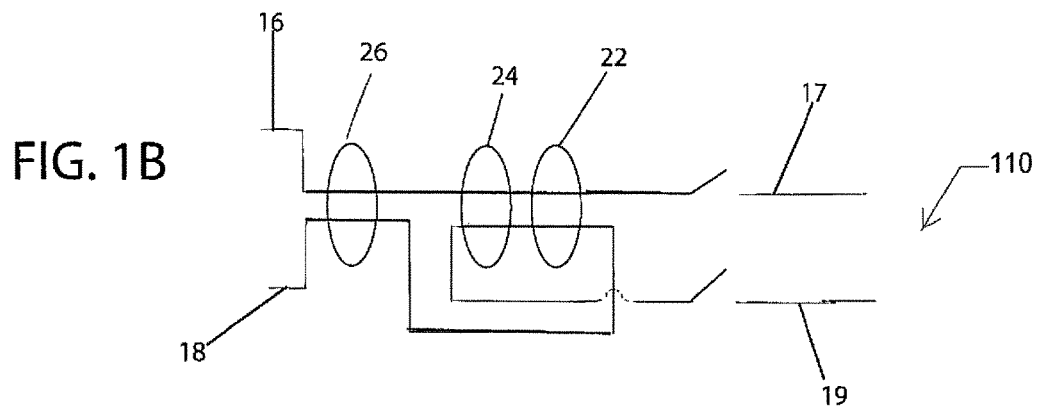

Any of the various sensors can be arranged and configured to monitor a single conductive path, e.g., a phase conductive path or a neutral conductive path. Alternatively, any one of the sensors can be arranged and configured to monitor both the phase and neutral conductive paths. In this latter instance, the conductive paths may be arranged in either the same or opposing current carrying directions with respect to the sensor. One example configuration is shown in FIGS. 1B and 1G, (FIG. 1G is an enlarged view of the wiring scheme 110 in FIG. 1A), where the current sensed by current transformer 24 is in the same current carrying direction. In this embodiment, the sensor senses a summation of the currents (i.e., to the extent the current signals are in phase, the signals are additive). If the conductive paths are arranged in opposite current carrying directions with respect to the sensor, the sensor would sense the differential of the two currents (i.e., the signals are subtractive).

It should be readily appreciated by those skilled in the art that any suitable number of conductive paths may be arranged to pass through or near any number of sensors in any suitable arrangement.

As shown in FIG. 1A, conductive paths 16, 18 are conductors that extend through the transformers or sensors, so that current signals derived from conductive paths 16, 18 are of the same polarity, that is they are additive/cumulative to one another; i.e., the current in both the phase conductive path 16 and the neutral conductive path 18 flows in the same direction. The line conductive paths 16 and 18 that pass-through high frequency sensor 22 induce a signal, e.g., a voltage, proportional to the rate of change of current through these conductive paths on the output of windings 22.1 (see FIG. 3A).

Since the current flowing on conductive paths 16 and 18 is in the same direction, the signal on the coil of sensor 22 will be additive, the output signal will be amplified when there is a series arc on either conductive path 16 or 18. In the event of a parallel arc from either conductive path 16 or 18 to ground, the current that is flowing through the arcing conductive path changes much more rapidly, creating a differential signal that is detected by sensor 22, which produces an output signal, e.g., an output voltage. Such an output signal may be used to determine whether there is an arc fault.

Alternatively, in another embodiment (shown in FIG. 1F), the conductive paths 16, 18 could be arranged to pass through the high frequency sensor 22 such that the current flows in opposite directions, that is the current is of the opposite polarity. In such an embodiment, in the event of a parallel arc from either conductive path 16 or 18 to ground, the rapidly changing current arising from the arc will be detected by sensor 22 which will generate an output signal, e.g., produce an output voltage. The output voltage may be used by the device to determine whether there is an arc fault. In the case of a series arc in either of the conductive paths 16, 18, the currents in conductive paths 16 and 18 would typically cancel each other out and essentially produce no output on a typical low frequency current transformer. In contrast, a measurable output signal may be generated nonetheless by a suitably configured and arranged high frequency sensor, at least in part due to the fact that arcing causes a phase shift in the currents flowing on the phase and neutral conductive paths which, in combination with the parasitic capacitance of the windings of the sensor, generates an output signal.

FIG. 1B is a simplified wiring diagram embodiment of the wiring scheme 110 shown in FIG. 1A. The arrangement in FIG. 1B includes a phase conductive path 16 and a neutral conductive path 18, as well as high frequency sensor coil 22 (e.g., a Rogowski), low frequency sensor 24 (e.g., a power line frequency/current sensor or current transformer), and a differential sensor 26. In this embodiment, the neutral conductive path 18 is arranged in a reverse direction so that the phase and neutral currents flow in the same direction through both high frequency sensor 22 and low frequency sensor 24. Since the current flows in the same direction, the signals which are monitored by high frequency sensor 22 and low frequency sensor 24 are of the same polarity and therefore do not subtract, or cancel each other out. Alternatively, a shunt can be used in place of either, or both, of low frequency sensor 24 and differential sensor 26. This shunt can be used to determine the level of current flow.

Figure 1C:
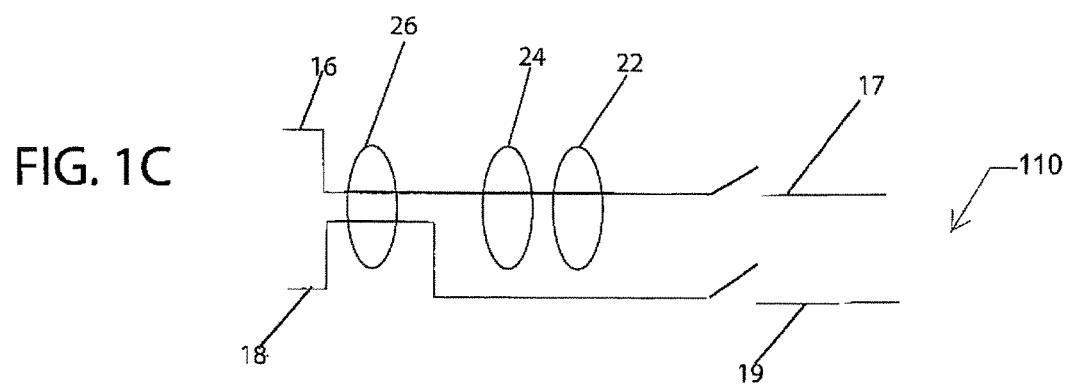

FIG. 1C is a simplified wiring diagram of another embodiment of the wiring scheme 110. The embodiment in FIG. 1C includes high frequency sensor 22, low frequency sensor 24, and differential sensor 26. In this embodiment, phase conductive path 16 passes through sensors 22, 24, 26, while neutral conductive path 18 only passes through differential sensor 26.

Figure 1D:
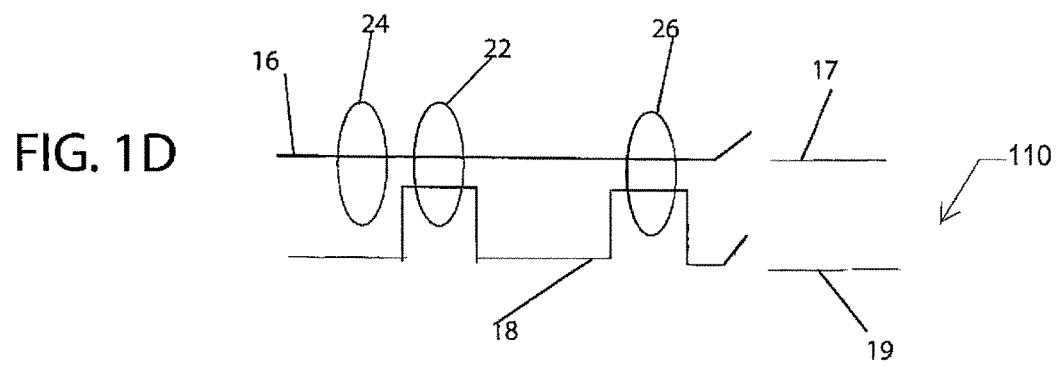

FIG. 1D is a simplified wiring diagram of another embodiment of the wiring scheme 110 shown in FIG. 1A. The embodiment in FIG. 1D includes high frequency sensor 22, low frequency sensor 24, and differential sensor 26. In this embodiment, phase conductive path 16 passes through, and is monitored by, all three sensors 22, 24, and 26; and, the neutral conductive path 18 passes through the high frequency sensor and the differential sensor 26.

Figure 1E:
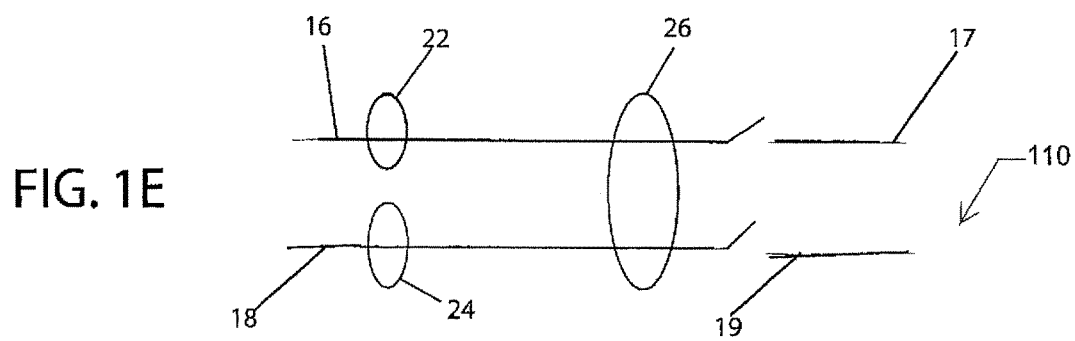

FIG. 1E is a simplified wiring diagram of another embodiment of the wiring scheme 110 shown in FIG. 1A. The embodiment in FIG. 1E includes high frequency sensor 22, low frequency sensor 24, and differential sensor 26. Phase conductive path 16 passes through high frequency sensor 22 and neutral conductive path 18 passes through low frequency sensor 24. In this arrangement, high frequency sensor 22 does not monitor neutral conductive path 18 and low frequency sensor 24 does not monitor phase conductive path 16. However, differential sensor 26 monitors both phase conductive path 16 and neutral conductive path 18.

FIG. 1F is a simplified wiring diagram of another embodiment of the wiring scheme 110 shown in FIG. 1A. The embodiment in FIG. 1F includes high frequency sensor 22, low frequency sensor 24, and differential sensor 26. Low frequency sensor 24 monitors phase conductive path 16. Both high frequency sensor 22 and differential sensor 26 monitor both phase conductive path 16 and neutral conductive path 18. Low frequency sensor 24 can be either a current transformer or a shunt 25 (see dotted line in FIG. 1F), or any suitable current sensor.

For the embodiment illustrated in FIG. 1F, the high frequency sensor 22 may alternatively incorporate a ferrite or magnetic core since in this arrangement the core is not likely to saturate because the low frequency components (e.g. 60 Hz power line) in phase conductive path 16 and neutral conductive path 18 should cancel each other out.

Advantageously, such an arrangement should allow the core to have a relatively small size, affording physical space savings for the device.

FIG. 1H is a simplified wiring diagram of another embodiment of the wiring scheme 110 shown in FIG. 1A. The embodiment in FIG. 1H includes differential sensor 26 and a plurality of shunts 25a and 25b. Differential sensor 26 monitors both phase conductive path 16 and neutral conductive path 18. Shunt 25a monitors phase conductive path 16 and shunt 25b monitors neutral conductive path 18.

As described above, any one of the wiring schemes of FIGS. 1B-1F can be used with any one of the embodiments shown in FIGS. 1A, 3A, 3B, and 3C.

FIGS. 2A-2B show two different possible arrangements for the conductive paths which are disposed in respective arrangement with sensors 20. For example, the embodiment in FIG. 2A illustrates conductive paths 16 and 18 disposed within a single insulator or dielectric sheath 18a. Alternatively, the conductive paths 16 and 18 could be disposed one inside of the other, as shown in the embodiment in FIG. 2B (e.g., a coaxial cable or conductor). In this embodiment, conductive path 16 is concentrically arranged with conductive path 18, with conductive path 18 disposed inside of conductive path 16. Preferably, in such an embodiment, conductive paths 16 and 18 would be separated by an insulator or dielectric 18b, and the entire concentric arrangement would be covered by insulator/dielectric 16a. As shown in FIG. 2B, insulator 18b insulates conductive path 16 from conductive path 18, while insulator 16a insulates conductive path 16 from outside elements. However, it should be appreciated that conductive paths 16 and 18 can be reversed.

Sensors 22, 24, and 26 can be placed in any suitable arrangement; e.g., one sensor may be placed, or nested, inside of another sensor such that one of the sensors physically surrounds another sensor. Alternatively, one of the sensors could be arranged and configured to surround the other two sensors. Still further, all sensors may be nested one inside the other where a first sensor is surrounded by a second sensor and the second sensor in turn is surrounded by a third sensor. Alternately, the sensors may be arranged side-by-side, or displaced from one another, at any physical spacing.

As shown in FIG. 1A, sensors 22 and 24 are arranged one inside the other, with low frequency sensor 24 being nested inside of high frequency sensor 22. These nested sensors can be positioned to be entirely concentric, or in certain preferred embodiments, these sensors could be nested but not entirely concentric, e.g. not sharing a common center point.

As shown in FIGS. 1B-1H, 2C-2F and 3A-3C and 3E, there can be different arrangements/configurations of these sensors. In one embodiment, low frequency sensor 24 can be mounted inside of the high frequency sensor 22. In such an arrangement, the high frequency sensor 22 may be less susceptible to low-frequency noise produced by, e.g., motor loads. Alternatively, it is possible to arrange high frequency sensor 22 inside of low frequency sensor 24, as shown in FIG. 2E.

FIGS. 2C, 2D, and 2E depict certain preferred embodiments for different arrangements/configurations of the sensors 20 depicted in FIG. 1A. FIG. 2C shows one possible sensor configuration 20a, wherein high frequency sensor 22 is arranged in axial alignment with low frequency sensor 24. In this embodiment, high frequency sensor 22 can either be concentric with, substantially concentric with, or disposed adjacent to low frequency sensor 24. Configurations such as these could allow space savings when housed inside of a single gang enclosure. For example, this type of nesting could result in a more shallow housing, such as disclosed in U.S. patent application Ser. No. 12/986,016 filed on Jan. 6, 2011, the disclosure of which is herein incorporated by reference in its entirety.

The embodiment in FIG. 2D shows another type of sensor configuration 20d. In this embodiment, the high frequency sensor 22 is configured with an air core that may consist of a plastic support, or any other non-ferrous support that supplies mechanical support for the windings 22b. As shown in this embodiment, the low frequency sensor 24 is arranged within the high frequency sensor 22, i.e., inside of the air core, where coil portions 22b are coiled around the air core and are physically/electrically insulated/isolated from the low frequency transformer 24.

FIG. 2E discloses another embodiment 20e of a sensor configuration 20, wherein high frequency sensor 22 is disposed inside of low frequency sensor 24.

FIG. 2F is another embodiment 20f of sensor configuration 20, wherein differential sensor 26 is arranged around both high frequency sensor 22 and low frequency sensor 24. This type of sensor configuration could be used with e.g., the wiring configuration of FIG. 1E.

FIGS. 3A, 3B, 3C, and 3E are detailed circuit diagrams of certain preferred embodiments of an arc fault circuit interrupter device. FIGS. 3D, 3E, and 3F are detailed views of certain circuit elements depicted in FIG. 3C. It should be understood that any one of the wiring schemes depicted in FIGS. 1A-1H may be used in the embodiments shown in FIGS. 3A, 3B, 3C, and 3E. Likewise, it should be readily understood that any one of the sensor configurations shown in FIGS. 2C-2F can be used in the embodiments shown in FIGS. 3A, 3B, 3C, and 3E.

The AFCI system is powered by power supply 40. Power supply 40 comprises a bridge 41 or 52 (diodes D2, D3, D4, and D5), diode D1, voltage regulator 170, capacitors C12 and C6, and resistors R18 and R16 (R18 and R16 set the output voltage of the power supply). Power supply 40 is configured to provide power to the components of the circuit, including, e.g., processor 100.

As will be discussed in greater detail below, certain UL criteria require that arc faults must be detected/determined within a preset time period to meet trip times. Therefore, it is advantageous to use a voltage regulator 170 that allows the entire circuit to power up faster (See FIGS. 1A, 3A, 3B, 3C, and 3D). This voltage regulator 170 is preferably configured to provide a constant/steady power supply to processor 100 allowing processor 100 to be fully powered on and operational in a relatively shorter period of time than if no voltage regulator was used and only a zener power supply was used.

Advantageously, a single voltage regulator could be configured to occupy less board space than would otherwise be taken up by a much larger power supply. The space savings realized by voltage regulator 170, in conjunction with the implementation of a low current processor 100, amplifier 154, and comparator/amplifier 156, could result in a simplified and more compact AFCI design.

As discussed, since low-power components can be used in certain preferred embodiments, the entire system can be powered with less than 10 milliamps. Further, in certain embodiments, voltage regulator 170 may be configured to be powered directly from a power line and therefore not require any intervening components for the power supply.

FIG. 3A shows a circuit diagram of a first embodiment of an arc fault circuit interrupter 6. As shown, line input conductive paths 11 include line side phase terminal 12 and line side neutral terminal 14. These terminals are coupled to their associated conductive paths, such as line side phase conductive path 16 and line side neutral conductive path 18, respectively. There are a plurality of sensors, such as high frequency sensor 22, low frequency sensor 24, and differential sensor 26. These sensors are electrically arranged along conductive paths 16 and 18 and are configured to read/sense a signal (e.g., current) present on these conductive, paths as described above.

Sensors 22, 24, and 26 each have associated coils. These coils are coupled to (i.e., in electrical communication with) processor 100. For example coil 22.1 is coupled to processor 100 and is adapted and configured to be a test coil to test sensor 22. Coil 22.2 is a coil adapted and configured to send a signal from sensor 22 to processor 100 that provides processor 100 with an indication of an arc event/fault. Coil 24.1 is a test coil coupled to processor 100. Coil 24.2 is configured to communicate with processor 100 to provide any necessary indication to processor 100. Coil 26.1 is coupled to processor 100 to provide an indication to processor 100 of the presence of a current differential.

In FIG. 3A, outputs of the sensors are coupled to analog signal processor 50 and/or analog signal processor 150 which are positioned between the outputs of the sensors and the inputs of processor 100. Low frequency sensor 24 is coupled to processor 100 via analog signal processor 50. Low frequency sensor 24 is coupled to winding 24.2, and winding 24.2 is coupled to parallel output lines 51.1 and 51.2. Resistor R21 is coupled across parallel output lines 51.1 and 51.2. In addition, bridge rectifier 52 is coupled to parallel output lines 51.1 and 51.2 and is configured to provide an absolute value reading of the current signal that is output from low frequency sensor 24. Bridge rectifier 52 is also coupled to zener diode Z1, which is coupled to ground. This absolute value signal passes into controllable voltage divider 54, which is comprised of resistors R11 and R15. The signal from current transformer 24 is therefore a measure of the absolute value of the current through the contacts. Processor 100 can use the contact absolute current value as part of its determination of whether an arc condition exists/occurred.

High frequency sensor 22 is coupled via winding 22.2 to processing circuitry 150, which is discussed in greater detail below.

Differential sensor 26 is coupled via winding 26.1 to processing circuitry including bridge rectifier 108. Additional processing circuitry can include: resistor R22 and capacitor C14 coupled in parallel to each other; and resistor R26 which is coupled in series with resistor R22 and capacitor C14. This circuitry in combination with sensor 26, can form a ground fault circuit 160 which is configured to allow sensor 26 to provide a rectified signal to processor 100, allowing processor 100 to determine whether a differential current exists along conductive paths 16 and 18. The existence of such a differential current can be indicative of a line irregularity, e.g., a ground fault or parallel arc fault to ground.

In FIG. 3A, the signal from current transformer 24 therefore measures the absolute value of the current through the contacts so that processor 100 can use this information as part of its detection of an arc fault condition. Low frequency sensor 24 is configured to have two windings, including a first winding 24.1 and a second winding 24.2. The first winding 24.1 is configured as a test winding and is connected to an input and/or output of processor 100. The second winding 24.2 is configured to read/sense a condition on conductive paths 16 and 18. Low frequency sensor 24 is coupled to processor 100 via an analog signal processor, such as analog signal processor 50. Winding 24.2 is coupled to parallel output conductive paths 51.1 and 51.2. Resistor R21 is coupled across parallel output conductive paths 51.1 and 51.2. Bridge rectifier 52 is also coupled to parallel output conductive paths 51.1, 51.2 and is configured to provide an absolute value reading of the current signal that passes from low frequency sensor 24. Bridge rectifier 52 is also coupled to zener diode Z1, which is coupled to ground. This absolute value signal passes into a controllable voltage divider 54, which is comprised of resistors R11 and R15.

Arc fault circuit interrupter 6, 6.1 etc. comprises additional circuitry, including switching circuitry 61 (which includes SCR 61.1) resistor R19, resistor R12 and capacitor C2 (which is coupled in parallel with resistor R12). Switching circuitry 61 is coupled to processor 100 and also has an output coupled to actuator 60 to selectively actuate actuator 60. Coupled between actuator 60 and switching circuitry 61 is additional circuitry including bridge rectifier 52 (comprising diodes D2, D3, D4, and D5) along with capacitor C9 and resistor R23.

Actuator 60 can be any form of actuator known in the art. As shown, actuator 60 comprises a solenoid having a coil 63 and plunger 65 configured to separate separable contacts 62.

Arc fault circuit interrupter 6 and 6.1, 6.2 also includes additional circuitry 171 comprising a voltage regulator 170 and additional components used to allow the device to power up faster. These components will be discussed in greater detail below. This embodiment also includes indication circuitry 90 comprising at least one indicator, such as LED LD1, and manual test circuitry comprising a switch 112 coupled to processor 100.

Processor 100 is configured to store or recall certain predetermined values/parameters relating to characteristics of arc faults and ground faults. Processor 100 is configured to output a trip signal to switching circuitry 61 to activate actuator 60 when processor 100 determines that the operating conditions meet, or are outside of, certain predetermined values/parameters.

FIG. 3B shows an alternative embodiment of an arc fault circuit interrupter 6.1 which includes an alternative ground fault circuit 161. This ground fault circuit 161 includes differential transformer 26 but also includes different analog to signal processing. For example, in this embodiment, voltage dividers 59 and 261 are incorporated as part of the analog signal processor. Voltage dividers 59 and 261 measure the current and differential current and current through the AFCI system and process the analog signals into digital signals for input into processor 100 from either current transformer 24 or differential transformer 26. Therefore, voltage divider 59 forms alternative circuitry to bridge 52, while voltage divider 261 forms alternative circuitry to bridge 108 depicted in FIG. 3A. The alternative circuitry depicted in FIG. 3B is designed to allow for the measurement of smaller current values by avoiding the signal losses associated with the bridges 108 and 52 in FIG. 3A.

Voltage dividers 59 and 261 are used to process the analog signals into digital signals such that the corresponding signals can then be fed into processor 100 from either current transformer 24 or differential transformer 26. Thus, voltage divider 59 may be used in place of bridge 52, while voltage divider 261 may be used in place of bridge 108 (see, e.g., FIG. 3A). Advantageously, the circuitry design of FIG. 3B enables the measurement of smaller current values because it avoids the potential signal losses associated with the bridges 108 and 52 shown in FIG. 3A. If there is no bridge positioned between sensor 26 and processor 100, and instead such alternative processing circuitry is used, the sensor would not have to be configured to produce an otherwise higher voltage signal. For example, the configuration of bridge 108, which includes a series of diodes, results in a voltage drop across the bridge. An associated sensor, such as sensor 26, must therefore generate a higher voltage signal to overcome this voltage drop to permit the resulting signal to be fed into processor 100.

FIG. 3C is an alternative embodiment to the embodiment shown in FIGS. 3A and 3B with more detailed portions of FIG. 3C being shown in FIG. 3D, FIG. 3E, and FIG. 3F. This embodiment differs from FIGS. 3A and 3B for example by having a different bridge 41.

For example, FIG. 3D is a more detailed view of level measurement circuit 130. As shown in this view there is an output from this circuit which is input into pin 20 of processor 100. In addition this circuit includes zener diode Z2, capacitor C10, coupled in parallel with zener diode Z2. In addition coupled in series with these components are resistors R10 and R17. Voltage level measurement circuit 130 is configured to output a voltage that is present on the line which reading is obtained periodically by processor 100.

Additional components that are also shown are the components of the power supply 40 including bridge 41, and voltage regulator 170 as well as additional circuitry such as resistors R9, R16, R18, and capacitors C6 and C1, which assist in providing an output such as 5 volts shown by the arrow indicating +5 v of power which is provided to the circuit.

FIG. 3E, a more detailed view of certain components depicted in FIG. 3C, includes a line side 11 and a load side 70. Line side 11 includes phase line contact 12 and neutral line contact 14. These contacts 12 and 14 are coupled to conductive paths 16 and 18, respectively. Conductive paths 16 and 18 each pass through differential sensor 26 and are then electrically coupled to high frequency sensor 22 and low frequency sensor 24. High frequency sensor 22 and low frequency sensor 24 are configured to detect signals on conductive paths 16 and 18. Conductive paths 16 and 18 include contacts 62, comprising contacts 64 and 66, which are formed as part of an interrupting mechanism 60 (see FIGS. 3D and 3E).

The load side contacts 62, on conductive paths 16 and 18, are arranged in the downstream side and supply power to load side 70. The load side of these conductive paths comprises load side phase conductor/conductive path 17 and load side neutral conductor/conductive path 19, which are disposed downstream of the line side of conductors/conductive paths 16 and 18. When contacts 62 are in a closed position, conductive paths 17 and 19 are electrically coupled to conductive paths 16 and 18, respectively.

As shown in the embodiment of FIGS. 3C and 3E, the high frequency sensor 22 includes two sets of windings or coils, including a first winding 22.1 and a second winding 22.2. The first winding 22.1 is electrically coupled to a TEST input processor 100. The second winding 22.2 is configured to pass a signal from the high frequency sensor 22 through conditioning circuitry and on to processor 100. Low frequency sensor 24 has one winding 24.1, configured to sense a signal on conductive paths 16 and 18.

In certain preferred embodiments, processor 100 can be programmed to periodically/automatically send a test signal via the TEST connection to winding 22.1. Winding 22.1 in turn creates a simulated fault in sensor 22 such that windings 22.2 or 24.2 sense/detect the presence of a fault/simulated fault, and communicate/pass this signal to processor 100.

Additionally, in the embodiment of FIG. 3C, there is a test switch 112 which when pressed/actuated (e.g., by an end user) is configured to start a manual test cycle by processor 100. Test switch 112 is configured to close a circuit and pass a signal into pin P16 of processor 100 (see FIG. 3F). In alternative embodiments, test switch 112 can be configured to directly activate the test circuit independent of processor 100. In addition, the test can also be initiated remotely, such as through communication circuitry 107 (see FIGS. 1A and 3C).

The pin configuration of processor 100 in a preferred embodiment will now be discussed and is depicted in FIGS. 3C and 3F. Pin P1 is a programming pin denoted as MCLR. Pins P2, P5, P11, and P13 are used only for pre-delivery testing (i.e.—at the factory). Pins P3, P4, P8, P9, and P10 are open pins and are not used. Pin P6 is an input denoted GFI and is configured to read an output from fault circuit 161 to allow processor 100 to determine whether there is a parallel arc fault to ground. Pin P7, denoted SCR, is configured to trigger silicon-controlled rectifier (SCR) 61.1. Pin P12 is a connection denoted TEST for high frequency sensor 22. The TEST connection includes capacitor C11 and resistor R24 and the output of pin P12 is an oscillation signal generated for reset of the device and testing of high frequency sensor 22. Pin P14, denoted LINE_CONNECTION, is coupled to the output of the current transformer and is used to determine the requisite trip time prescribed by UL. Pin P15, denoted CLK, is a programming pin. Pin P16, denoted DAT, is configured to receive a signal created by actuation of test switch 112 and may also be a programming pin. Pin P17, denoted GND, connects to ground. Pin P18, denoted V+, is configured to receive power from a power supply. Pin P19, denoted DETECTOR, is configured to receive an input from comparator circuit 156 in the form of a timer input/timing signal. Pin P20, denoted LINE_MONITOR, is configured to receive an input from the voltage level measurement circuit 130 and is utilized in the process/subroutine for parallel arc detection/determination.

Alternative processors are shown in the different embodiments (e.g., processors in FIGS. 3A, 3B, 3C, and 3E), and it should be understood that any suitable processor may be substituted for processor 100 without departing from the spirit of the invention. Pins in one embodiment may have a different location on the processor (i.e. different pin reference number) while still having the same function as pins in another embodiment.

Preferably, a device in accordance with certain preferred embodiments should be able to avoid/minimize nuisance tripping/detection and distinguish between dangerous arcs (e.g., those due to a damaged conductor) and harmless or benign arcs (e.g., those due to a fan motor or drill). Harmless arcs that may occur during normal operation of certain common electrical devices may be found in brushed motors (typically with signals in the range of 2-4 MHz), switching power supplies, ballasts, and dimmers. It has been observed through empirical observations that unwanted arcing typically generates a signal within a 4-10 MHz frequency range, which is typically much higher than signals generated by harmless arcs.

FIG. 4A is a depiction of how the device determines whether series arcing may be present. Series arcing is determined using the processor 100 (See FIG. 1A) which reads a plurality of different parameters in the circuit and then performs any one of a plurality of different steps outlined in FIG. 4A to determine whether a series arc fault has occurred.

In the discussion below, several parameters are referred to, and some exemplary definitions are provided in accordance with at least one embodiment of the invention. It should be noted that these exemplary definitions are by no means limiting and those having ordinary skill in the art would readily understand that alternate embodiments may employ alternate parameters without departing from the spirit of the invention.

Processor 100 takes, calculates, samples or receives certain measurements, readings and/or data periodically during operation of the device. There are at least three different types of periods or time periods that can be calculated by a processor such as processor 100. For example, a first time period could be a minimum time period for determining an arc. A second time period could be a fraction of that time period, wherein this second time period could be used by the arc fault circuit to determine across several intervals particular line characteristics. A third time period could be an extended time period comprising at least one first time period but in at least one embodiment, multiple consecutive first time periods discussed above. This third time period could be a recording time period for recording measured and calculated results relating to the measurement or calculation of electrical line characteristics that may be present on a line. In at least one embodiment, a first time period could be a "processor half cycle". In at least one embodiment, a second time period could be a measurement/sampling period, while a third time period could be a an "arcing window" which is a predefined time period for recording or sampling electrical line characteristics to determine the presence of an arc. While the above terms "processor half cycle"; "measurement sampling period; and "arcing window" are provided as examples, other types of time periods could be used as well by an arc fault circuit to determine the presence of an arc.

The concept of a measurement/sampling period is useful for referring to the smallest unit of time over which certain data is acquired/sampled by the circuitry of the device and/or calculated by one or more sets of instructions carried out by the processor. The concept of a "processor half cycle" is a useful construct in order to comply with certain code-required conditions; e.g., UL specifies detection/trip performance characteristics for devices that comply with UL's arc fault listing/certification program(s). A processor half cycle is defined by a predetermined number of measurement periods (e.g., consecutive measurement periods) over which the processor analyzes the data acquired to determine whether an arc fault has occurred in accordance with the UL requirements. In certain embodiments the processor half cycle and the measurement period may be chosen such that the time period covered by a processor half cycle is approximately the time period of an AC half cycle. An AC half cycle is simply one half of the period of time of a full AC cycle (e.g., $\frac{1}{120}$ second or 8.33 milliseconds for a standard 60 Hz AC wave). For example, if we define a processor half cycle to include 32 measurement periods, with each measurement period equaling 250 microseconds, the processor half cycle would equal an 8 millisecond period of time, which is roughly equivalent to the period of time of an AC half cycle in a 60 Hz system (i.e., 8.33 milliseconds). In addition to the data acquired for every measurement period throughout the processor half cycle, certain other data may be acquired/calculated by the processor 100 at the beginning or end of every measurement period, e.g., voltage. While the time periods for the processor half cycle and measurement period are provided by way of example above. Processor 100 could be reprogrammed such that these values could be different. For example the first time period could be a different time period such as but not limited to any one of a full cycle time period, a ¼ or 0.25 cycle time period, 7 milliseconds, 9 milliseconds or any time value range such as 1-10 milliseconds. Accordingly the second time period being a fraction of the first time period could also be reprogrammed in processor 100 as well. For example, the second time period or measurement period could be any one of 250 microseconds as provided above or between 100 microseconds and 500 microseconds or any other appropriate value. Thus processor 100 could also be programmed to have more than 32 measurement periods for each first time period as well.

It should be readily understood that while the period of time chosen to represent the processor half cycle does not necessarily have to equal the period of time for an AC half cycle, it could be chosen as such without deviating from the teachings disclosed herein. Similarly, and particularly where the period of time representing the processor half cycle does not equal that of an AC half cycle, the processor half cycle does not necessarily have to be synchronized with the AC half cycle; i.e., the processor half cycle does not need to be synchronized with the zero crossing points of the AC half cycle. Certain preferred embodiments use a processor half cycle that is chosen to be less than the AC half cycle and therefore by extension, not synchronized with the AC half cycle zero crossing. In such preferred embodiments, compliance with UL requirements may be easier to achieve and/or more stringently adhered to since many of the conditions prescribed by the UL requirements are based on the longer timing of the AC half cycle.

Processor 100 is programmed and configured to use a "shift register" in order to continually evaluate the conditions being monitored by the arc fault circuit interrupter device. The shift register may be any memory space, or register, of recorded information; e.g., the processor could be programmed with a set of instructions implementing a binary shift register where each bit of the register records either a "1" or a "0" representing the recorded information. Each bit of the shift register could be utilized to record information representing a specific processor half cycle. Therefore, for example, if it was advantageous to continually evaluate whether arcing has occurred within the last 1 second of time and one were using 32 measurement periods, with each measurement period equaling 250 milliseconds, then a 120 bit shift register could be employed. Accordingly, to continually monitor/evaluate certain conditions, a new bit would be added to the shift register in one furthest position in the register (e.g., the rightmost register location) and the oldest bit in the opposite furthest position in the register would be dropped (e.g., the leftmost register location). Thus the processor would have a sliding window of bits representing a certain predetermined number of processor half cycles which corresponds to a predetermined amount of time.

In preferred embodiments, each bit in the shift register would record whether or not the processor has determined that an arcing event has been detected within the processor half cycle corresponding to that bit; i.e., an arcing processor half cycle. A bit that is recorded in the shift register to indicate a processor half cycle in which arcing was detected is sometimes referred to herein as an "arcing bit" and may be recorded in the shift register, e.g., as a "1".

For every measurement period or sampling period (e.g., every 250 milliseconds), in addition to recording values of the current detected by the current sensor (e.g., current passing through the device from line to load terminals or through a connected load) and the differential current detected by the differential current sensor, data related to the frequency of any electrical noise detected by the low and high frequency sensors and processed by the comparator (e.g., output of comparator provides frequency of signal detected) is analyzed by the processor for each measurement period. For any measurement period in which low frequency noise is observed (e.g., the output of the comparator for a given measurement period indicates that electrical noise with a frequency in the range of, e.g., 2-below 4 MHz was detected) the processor would increment a counter, Nlo. Since the low frequency counter Nlo is reset for each processor half cycle, Nlo is a count of the number of measurement periods within a processor half cycle that have experienced low frequency noise. Similarly, for any measurement period in which high frequency noise is observed (e.g., the output of the comparator for a given measurement period indicates that electrical noise with a frequency in the range of, e.g., 4 MHz or above, or in a preferred embodiment, at least 4 MHz or above and up to 10 MHz was detected) the processor would increment a counter, Nhi. Since the high frequency counter Nhi is reset for each processor half cycle, Nhi is a count of the number of measurement periods within a processor half cycle that have experienced high frequency noise. While the above frequency ranges of 2-4 MHz and 4-10 MHz were provided as a first frequency range and a second frequency range, these ranges could be adjusted by reprogramming processor to a different set of ranges. Therefore, instead of a first threshold value at 2 MHz that value could be set at a different number such as 1 MHz, 1.5 MHz 2.5 MHz or any one of a first range of values such as but not limited to 1 MHz to 3 MHz.

The second threshold value of 4 MHz could also be adjusted such that processor could be reprogrammed to have a different number such as any number higher than the first threshold value. This value could be any one of but not limited to: 3 MHz, 5 MHz, or any range of value from 1.5 to 8 MHz for example.

Data that is being acquired/measured and/or calculated throughout any given processor half cycle might also include the current jump, the maximum current jump, the average current and the maximum average current over different recording or third time periods (e.g., maximum average current for the most recent: 100 milliseconds, 200 milliseconds, 400 milliseconds and 1000 milliseconds; these may sometimes be referred to herein as "arcing windows"). The above time periods are only being provided as examples. Thus, these arcing windows can be in the form of a range of times as well. For example, a first arcing window could be considered a largest arcing window which has the longest time period which can be any appropriate time period. That time period could be any selected predetermined time period which could be 1 second as described above, or be smaller such as 0.5 seconds or larger such as 2 seconds or more, thus there could be a time range for selection such as any one of 0.25 seconds to 2 seconds or more for example. A second arcing window could be a smaller arcing window which could be a fraction of the time of the first or largest arcing window. There could be least one third arcing window could be a further smaller arcing window which is an arcing window which is a fraction of the time of the first and the second or smaller arcing window. At least one fourth arcing window would then be a fraction of the at least one third arcing window. In addition while an example of four arcing windows is used, more arcing windows could also be calculated by processor 100 as well.

The current jump is simply the difference between the measured current between any two successive measurement periods. The maximum current jump is the highest value for the current jump measured during a processor half cycle; e.g., the highest current jump between any two of the 32 consecutive measurement periods that make up a processor half cycle. The average current is the average rectified current for any given processor half cycle period. The maximum average current for the last: 100 milliseconds, 200 milliseconds, 400 milliseconds and 1000 milliseconds is the highest average current of any processor half cycle found within the respective time period (i.e., 100, 200, 400 and 1000 milliseconds). The average differential current is an average value of the differential current measured by the differential sensor over the course of a processor half cycle.

The following provides one illustrative example of the instructions carried out by processor 100 during operation of the arc fault circuit interrupter device. Once processor 100 is energized, in step S1, it initiates a clock (e.g., using an internal oscillator) which it uses to drive its operations in accordance with the processor clock cycles. For example, the processor 100 uses the clock cycle signal to periodically acquire data and/or perform certain calculations on the data. In the current embodiment, processor 100 may take different measurements during different time periods such as: (i) every measurement period (e.g., 250 microseconds), (ii) every processor half cycle (e.g., 8 milliseconds), and (iii) every predefined arcing window (e.g., the most recent 100 milliseconds, 200 milliseconds, 400 milliseconds, and 1000 milliseconds). During each measurement period 401, in step 2, processor 100 reads the following characteristic parameters of the circuit: current, differential current, and frequency of any electrical noise. Current is measured in any one of the circuits 5, 6, 6.1, 6.2 using current transformer 24 or shunt 25 (See FIG. 1F). Differential current is measured in any one of the circuits using differential transformer 26 in a known manner as described above. Frequency is measured using high frequency coil 22, and the additional signal processing circuitry 50 and 150. If processor 100 determines that the frequency is between 2 MHz and 4 MHz, a counter Nlo is incremented. If processor 100 determines that the frequency is between 4 MHz and 10 MHz, a counter Nhi is incremented. The counters, Nhi and Nlo, are reset for each processor half cycle (e.g., after every 32 measurement periods).

In step S3, and as shown in graphical box 403, the processor sequences or groups 32 consecutive measurement periods into a processor half cycle 501 (See also FIGS. 5A-5F). In step S4, processor 100 performs a set of programming instructions to determine the following general characteristic parameters for the processor half cycle: average rectified current, peak current and maximum current jump. In step S5, a voltage measurement is also recorded using the voltage level circuit 130 (See FIG. 3D) at the end of each processor half cycle (alternatively, the voltage measurement can be recorded at the beginning of each processor half cycle). After each processor half cycle, processor 100 resets the voltage measurement circuit by discharging the integrating capacitor.

In step S6, processor 100 then proceeds to determine whether the processor half cycle under consideration contains arcing using the data and values gathered for each measurement period. For each processor half cycle, processor 100 determines whether arcing was present and in step S7, inserts a bit into the shift register indicative of this determination. Processor 100 determines whether arcing was present by evaluating the following two conditions: Nhi−Nlo>3 and there was a non-zero current measured for at least two of the measurement periods comprising the processor half cycle. If both of these conditions are satisfied, then processor 100 inputs an arcing bit (for example, a "1") into a bit of a shift register. Otherwise, processor 100 inputs a non-arcing bit (for example, a "0") into the shift register 505 in step s7 as shown in graphical box 408. As discussed above, shift register is an "arcing array" which is a series of 120 recorded bits where each bit stores either an arcing bit or a non-arcing bit for 120 consecutive processor half cycles (i.e., an arcing array indicative of recorded arcing events occurring over the most recent 1 second. Processor uses the shift register 505 to determine whether dangerous arcing is present in the circuit and therefore whether to interrupt the circuit. \

While 120 recorded bits are presented as an example above, other amounts of bits for a shift register could be used such as 100 bits, one preferred embodiment of 128 bits, 150 bits or any one of a range such as 1-1000 bits.

As indicated above, shift register 505 is essentially a sliding window analyzing the latest 1 second of signal information that updates by adding the most recent bit 509 from the most recent processor half cycle into one end of the shift register and discharging the oldest bit 511 from the opposite end of the shift register. FIG. 4A shows a condensed version wherein the most recent bit is shown as bit 509 while the 120$^{th}$ bit is shown graphically as bit 511. It should be noted that for convenience and processor efficiency, the shift register may use 128 bits and still not depart from the teachings herein.

Processor 100 is programmed with a set of instructions to send a trip signal to the circuit interrupting circuitry based upon a certain parameters. In the case of a series arc, the UL requirements specify various trip conditions for various different levels of arcing detected within certain defined time periods. Specifically, UL requires any certified arc fault circuit interrupter device to trip if: 1) 8 arcing half cycles have been observed within the last 100 milliseconds while the circuit is carrying 30A of current; 2) 9 arcing half cycles have been observed within the last 200 milliseconds while the circuit is carrying 20A of current; 3) 12 arcing half cycles have been observed within the last 400 milliseconds while the circuit is carrying 10A of current; and 4) 35 or more arcing half cycles have been observed within the last 1 second (1000 milliseconds).

Therefore, as shown in step S8, processor 100 uses two parameters to determine if certain conditions exist which would require it to issue a trip signal. The first parameter is the maximum average current over the different arcing window intervals (i.e., the UL requirements result in four arcing windows, 100 milliseconds, 200 milliseconds, 400 milliseconds and 1000 milliseconds). The second parameter is the number of arcing bits within the various arcing windows.

The maximum average current is calculated for the four arcing windows, consisting of the latest: 100 millisecond time period; 200 millisecond time period; 400 millisecond time period; and 1000 millisecond (1 sec) time period. In step S8 as shown, processor 100 determines whether interrupt mechanism 60 should trip or open the contacts if any one of the following conditions occur:

1) If there is a maximum value of average current that exceeds 30 amps within the last 100 milliseconds and the shift register contains at least eight (8) arcing bits within this last 100 milliseconds;
2) If there is a maximum value of average current that exceeds 20 amps within the last 200 milliseconds and the shift register contains at least nine (9) arcing bits within this last 200 milliseconds (See for example arcing window 516 in FIG. 5F);
3) If there is a maximum value of average current that exceeds 10 amps within the last 400 milliseconds, and the shift register contains at least twelve (12) arcing bits during the last 400 milliseconds (See for example arcing window 517 in FIG. 5E; or
4) If there are 35 or more arcing bits in the shift register in one (1) second of time. This is regardless of a determined maximum value of average current (See for example arcing window 518 in FIG. 5D).

If processor 100 determines that there is a perceived arc fault based upon the above conditions, in step 9, it sends a trip signal to interrupt mechanism 60 to trip the contacts and open the circuit.

While the above threshold current values of 30 amps 20 amps, 10 amps are used, processor 100 could be programmed to have different values. For example the first threshold of 30 amps could be simply a highest threshold value of any appropriate value such as but not limited to 20 amps, 25 amps or anywhere within a range of 1-100 amps for example. The second threshold current value which was provided above as 20 amps could be any value that is lower than the first threshold value. The third threshold current value which was given above as 10 amps could be any value that is lower than the second threshold value.

In addition to detecting dangerous series arcing conditions, the device is also configured to detect dangerous parallel arcing; i.e., non-nuisance parallel arcing. As already discussed, there are at least two types of parallel arcing that can occur in one or more scenarios: (i) parallel arcing between the phase and/or neutral conductive path and ground (parallel arc fault to ground), and (ii) parallel arcing between the phase and neutral conductive paths.

FIG. 4B illustrates one or more processes the device carries out in order to detect whether dangerous parallel arcing conditions exist between the phase or neutral conductive paths and ground. In the discussion that follows, this may be referred to as parallel arcing to ground. Processor 100 carries out a set of instructions and performs certain operations to read/detect certain circuit parameters/conditions. In preferred embodiments, processor 100 is programmed with a set of instructions to detect both types of dangerous parallel arcing conditions in any suitable manner; e.g., through multiple processor threads/processes sequentially, or preferably concurrently (or in any suitable manner).

As discussed above, once processor 100 is energized it uses its internal clock signal to perform certain processes/operations to acquire, read, calculate, and/or retain data periodically. As previously noted, the processor carries out certain instructions/operations to control the reading/sensing of the differential current flowing through the device circuitry using the differential core. For every processor half cycle, processor 100 calculates the average of the differential current readings for the group of measurement periods constituting the processor half cycle. In step S11, processor 100 determines whether the average differential current is greater than a predetermined value/threshold; e.g., five (5) amps. If the average differential current calculated in step S11 is determined to be above the predetermined threshold value, in step S12 processor 100 increments a ground fault counter (NGF) and checks to see whether this is the first such excursion. If the processor determines that it is the first such excursion (e.g., NGF=1) it then initializes a ground fault timer for a predetermined period of time; e.g., one half second (0.5 sec). As depicted in step S14, for each subsequent processor half cycle during the 0.5 sec ground fault timer period, processor 100 monitors the average differential current for any additional excursions beyond/above the predetermined threshold value and increments the ground fault counter NGF by one for each such excursion encountered during the 0.5 sec ground fault timer period.

In step S15, the processor determines whether the ground fault counter NGF is greater than or equal to two a certain predetermined value/limit, e.g., two (2), during the 0.5 sec ground fault timer period. If the ground fault counter NGF is greater than the predetermined limit, in step S16 processor 100 determines that a parallel arcing to ground conditions exists or has occurred. If the 0.5 sec ground fault timer period expires without the processor 100 determining that a parallel arcing to ground condition has occurred, the ground fault timer and ground fault counter NGF are reset (i.e., NGF is set to zero).

If processor 100 determines that parallel arcing to ground has occurred, processor 100 is preferably programmed to send one or more signals as depicted in step S17. These signals may be any suitable signals such as but not limited to trip signal(s) and indication signal(s). For example, in step S17a a trip signal is sent by processor 100 to interrupt mechanism 60. This results in the circuit interrupting mechanism interrupting power between the load, line and/or face connections. Processor 100 could be programmed with a set of instructions causing it to send one or more indication signals; e.g.: to a visual indicator 104; to an audible indicator 106; and/or to communication circuitry 107 to communicate on a network with other networked devices such as a server or a personal computer (See also FIG. 1A). One or more of these signals may be sent simultaneously, sequentially, or in combination or in any suitable sequence. While example values have been provided above, for the NGF counter, different values could also be used such as but not limited to any one of a range of 1-1000 for example. This different value could be programmed into processor 100 to provide the appropriate counter value.

Figure 4C:
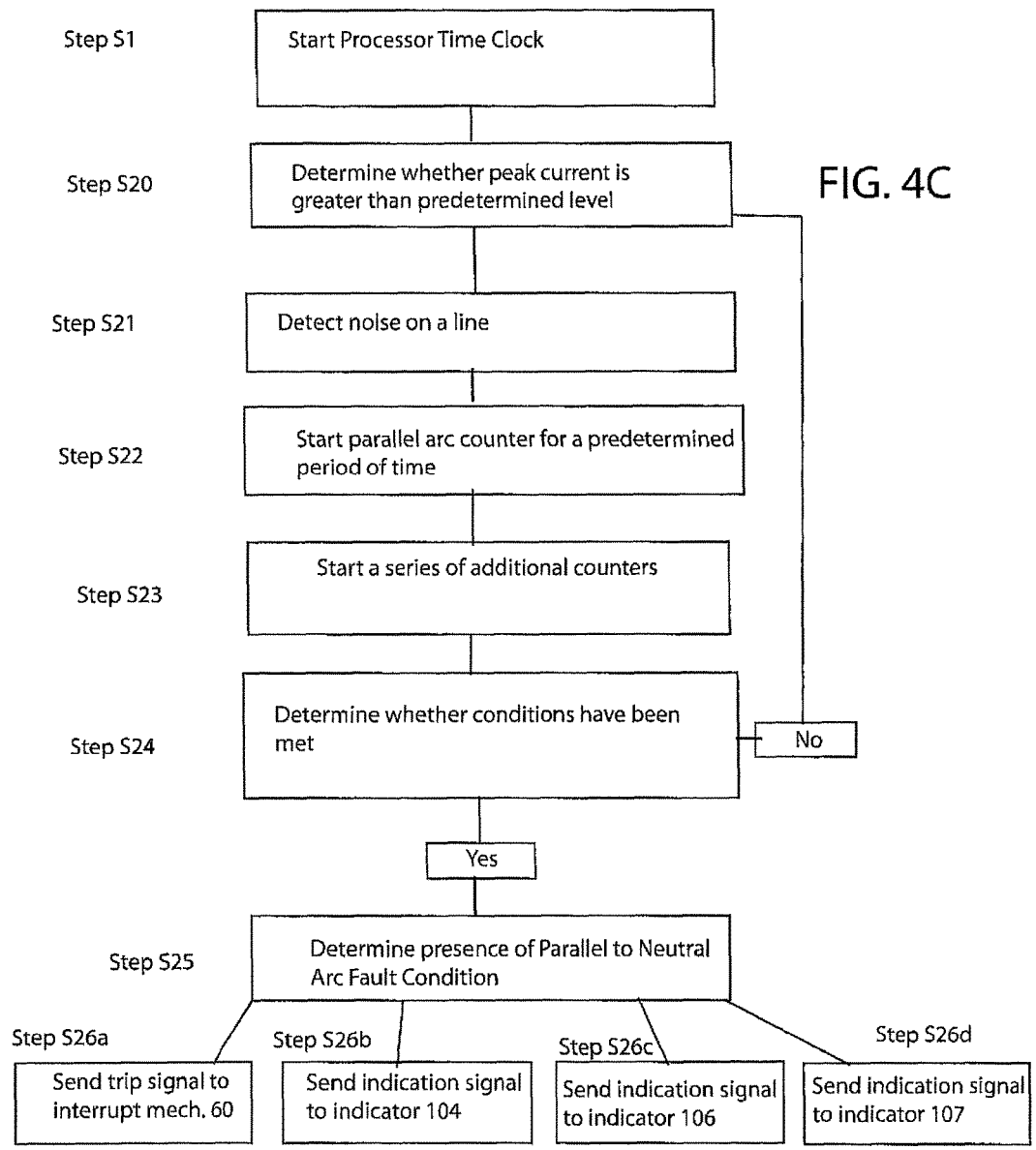
FIG. 4C is a flow chart for the process for determining a parallel to neutral arc.

FIG. 4C illustrates how the device determines whether parallel arcing exists in the phase or neutral conductive paths; e.g., between the phase conductive path and the neutral conductive path. This may be also referred to as parallel arcing or parallel arcing to neutral in the discussion that follows. As discussed above, during every measurement period, processor reads: current, differential current, voltage, and frequency (or data related thereto). The current read by processor 100 is the absolute value of current detected by the current sensor (e.g., current passing through the device from line to load terminals or drawn by one or more connected loads). The differential current is the differential current detected by the differential current sensor. As discussed previously, the voltage is preferably measured at the end of each processor half cycle using, e.g., the voltage level circuit 130 (See FIG. 3D). Alternatively, the voltage may be measured at the beginning of each processor half cycle.

Using the data from each measurement period the processor also carries out a set of programming instructions to determine/calculate the peak current and average rectified current for each processor half cycle. Peak current is the highest current measured for a given processor half cycle (i.e., the highest detected current value for any given measurement period within the processor half cycle). Average rectified current is the average of the rectified current measurements over the processor half cycle (i.e., the average of the rectified current measured for each of the measurement periods constituting the processor half cycle; e.g., 32).

For each measurement period the processor 100 also analyzes the frequency of the signal to determine if low frequency or high frequency signals/noise are detected. Based on the frequency detected, one or more counters may be incremented/decremented, or adjusted. Alternately, the detected frequencies may be recorded/stored in any suitable manner. In at least one embodiment, if processor 100 determines that the frequency measured/sensed for a given measurement period is within a certain predetermined low frequency range, e.g., 2-<4 MHz, a counter Nlo is incremented. If processor 100 determines that the frequency measured/sensed for a given measurement period is within a certain predetermined high frequency range, e.g., 4-10 MHz, a counter Nhi is incremented. Alternatively, processor 100 could be programmed to increment the high frequency counter Nhi if it determines that the measured/sensed frequency is greater than a certain predetermined value; e.g., 4 MHz.

For each processor half cycle, processor 100 carries out a set of instructions to monitor the data being collected, computed and/or stored to determine if certain conditions, or events, have occurred. In particular, processor 100 monitors for voltage drop values and current peaks that meet or exceed certain predetermined values. If the processor determines that a voltage drop between any two consecutive processor half cycles is greater than a certain predetermined value, e.g., any one of 25-100 volts or more particularly 50-60 volts or even more particularly 50 volts, 55 volts or even 60 volts, then the processor sets a voltage drop flag (VDF) associated with the processor half cycle under consideration. Alternatively, voltage drop flag VDF may be implemented via a counter, or any other suitable memory element. If the processor detects both that: a peak current value for the processor half cycle under consideration meets or exceeds a certain predetermined value/threshold, e.g., 24 amps or for example any one of a range of values such as but not limited to 5 amps, 20 amps, 100 amps or, for example any one of a range of values 5-100 amps; and there was either, or both, low or/and high frequency noise detected during the processor half cycle, then the processor would increment a parallel arc interval counter (PC). The processor then determines if this was the first parallel arc pulse/signal detected (e.g., PC=1). If this was the first parallel arc pulse, then the processor would initialize a parallel arc timer for a period of one half second (0.5 sec). The processor would then continue to update the parallel arc interval counter PC for the remaining duration of the parallel arc timer period, incrementing the counter if the prescribed conditions are met for any subsequent processor half cycles within the parallel arc timer period. During this parallel arc timer period, the processor also maintains/updates a current rise/jump counter (IRC) and a current break/drop counter (IBC).

The current rise/jump counter is incremented by the processor when it determines that the difference in the measured rectified current between two successive measurement periods within the processor half cycle is greater than a certain predetermined value; e.g., a difference of 20 amps measured between any two successive measurement periods. While an example of 20 amps is provided above, other values could be used such as but not limited to 5 amps, 10 amps, 25 amps or any one of a range such as 5-100 amps.

The current break counter is incremented by the processor when it determines that for the processor half cycle under consideration: the parallel arc interval counter is non-zero and either: (a) the average rectified current is below a predetermined value (e.g., any one of but not limited to: 6 amps, 5 amps, 1 amps, 10 amps 20 amps, 100 amps or an one of a range of values between 1-100 amps), or (b) the peak current is below a predetermined value (e.g., 10 amps or any one of but not limited to: 6 amps, 5 amps, 1 amps, 20 amps, 100 amps or an one of a range of values between 1-100 amps).

In addition to the peak current being determined/evaluated by the processor for each processor half cycle, two peak current counters are employed by the processor during the parallel arc timer period to track peak currents that are greater than certain predetermined values. In at least one embodiment, there are two peak current counters denoted as Nbig and Nhuge. Peak current counter Nbig is incremented when the peak current for a processor half cycle within the parallel arc timer period is greater than a first threshold; e.g., 65 amps or any one of but not limited to: 30 amps, 50 amps, 70 amps, or 100 amps or any one of a range of values between 1-100 amps. Peak current counter Nhuge is incremented when the peak current for a processor half cycle within the parallel arc timer period is greater than a second threshold; e.g., 100 amps or any one of but not limited to: 30 amps, 50 amps, 70 amps, or 110 amps, 200 amps or any one of a range of values between 1-200 amps. Processor 100 may also be programmed with a set of instructions to maintain/update a noise counter NC during the parallel arc timer period which is incremented by processor 100 if it determines that during the parallel arc timer period any given processor half cycle is evaluated to be an arcing half cycle (i.e., the arcing array/shift register value for that processor half cycle equals "1").

With reference to FIG. 4C and the previously described counters, variables, flags, values and arcing array, a process carried out by the processor for determining whether a dangerous parallel arcing condition exists or has occurred will now be described. In at least one preferred embodiment, processor 100 evaluates a number of conditions/criteria to determine whether a dangerous parallel arc fault condition has occurred or exists and whether or not the device should then signal the interrupting mechanism to interrupt one or more of the conductive paths as well as possibly indicate such condition as discussed above.

For example, as shown in FIG. 4C, in step S20, processor 100 determines whether a peak current for any given processor half cycle is greater than a predetermined level. In at least one example, this predetermined level is 24 Amps but as discussed above, this value could be different or selected from a range provided above. In step S21 processor 100 detects whether there is a signal with a frequency indicative of noise on the line (i.e., one or both of the counters Nhi or Nlo has a value greater than "1"). If both conditions (peak current above a predetermined level and noise is present) are true, in step S22, processor 100 increments parallel arc interval counter PC and if this is the first such pulse recorded (i.e., PC=1), starts a timer (e.g., initializes parallel arc timer for a predetermined period of time which can be any appropriate period of time such as but not limited to: 0.5 sec. 0.25 sec. 1 sec. 10 sec. or any one of a range of values such as 0.1-10 seconds) Next, in step S23 processor 100 monitors or starts the following remaining counters: peak current counter Nbig, peak current counter Nhuge, a current break counter IBC, a current rise counter IRC, and a noise counter NC. In step S24, processor 100 determines if one of the following five conditions is true: the first condition is true if parallel arc interval counter PC is greater than three (3) (other values could be used such as 1, 2, 4, or any one of a range such as 1-100) and current break counter IBC is greater than one (1) however any one of other values could be used such as 2, 3, 4, 5, or any one of a range such as 1-100.

The second condition is true if peak current counter Nbig is greater than three (3) (other values could be used such as 1, 2, 4, or any one of a range such as 1-100) and noise counter NC is greater than one (1) (other values could be used such as 2, 3, 4, or any one of a range such as 1-100) and at least one of the following is true: (i) current break counter IBC is nonzero or any other suitable number such as within a range of 1-100), or (ii) voltage drop flag VDF is set. The third condition is true if peak current counter Nhuge is greater than one (1) or any other suitable predetermined value such as within a range of 1-100, and noise counter NC is greater than two (2) or any other suitable predetermined value such as within a range of 1-100, and at least one of the following is true: (i) current break counter IBC is nonzero or any other suitable value such as within a range of 1-100, or (ii) voltage drop flag VDF is set. The fourth condition is true if noise counter NC is greater than three (3) or any other suitable predetermined value such as taken from within a range of 1-100 and current rise counter is greater than one (1) or any other suitable value such as within a range of 1-100. The fifth condition is true if parallel arc counter PC is greater than three (3) or any other suitable value such as within a range of 1-100 and current rise counter IRC is greater than one (1) or any other suitable value such as a predetermined value selected from within a range of 1-100.

If any of these five conditions are satisfied while there is remaining time on the parallel arc timer, processor 100 determines in step S25 that a dangerous parallel arcing condition exists or has occurred. Otherwise, processor 100 determines that no dangerous parallel arcing condition exists or has occurred (e.g., processor determines that conditions which initiated the parallel arc timer may be ascribed to non-dangerous arcing, or nuisance arcing), stops the parallel arc timer (i.e., parallel arc timer period expires), and resets the above counters and flags.

In step S26, if processor 100 has determined that dangerous parallel arcing conditions exist or have occurred, processor 100 can take one or more actions. For example, in step S26*a* a trip signal is sent by processor 100 to interrupt mechanism 60, thereby removing power from one or more connected loads and mitigating fire risk. To indicate the detection of dangerous arcing conditions and/or the corrective action taken to trip the device, processor 100 can be programmed to take one or more of the steps S26*b*-S26*d*. In step S26*b*, processor sends an indication signal to a visual indicator 104. In step S26C processor 100 sends an indication signal to an audible indicator 106. In step 26*d* processor 100 sends a communication signal to a communication circuitry 107 to communicate on a network with other networked devices such as a server or a personal computer (See also FIG. 1A). Processor 100 can perform any one or more of the steps 25*a*-25*d* simultaneously or in any suitable order.

Figure 4D:
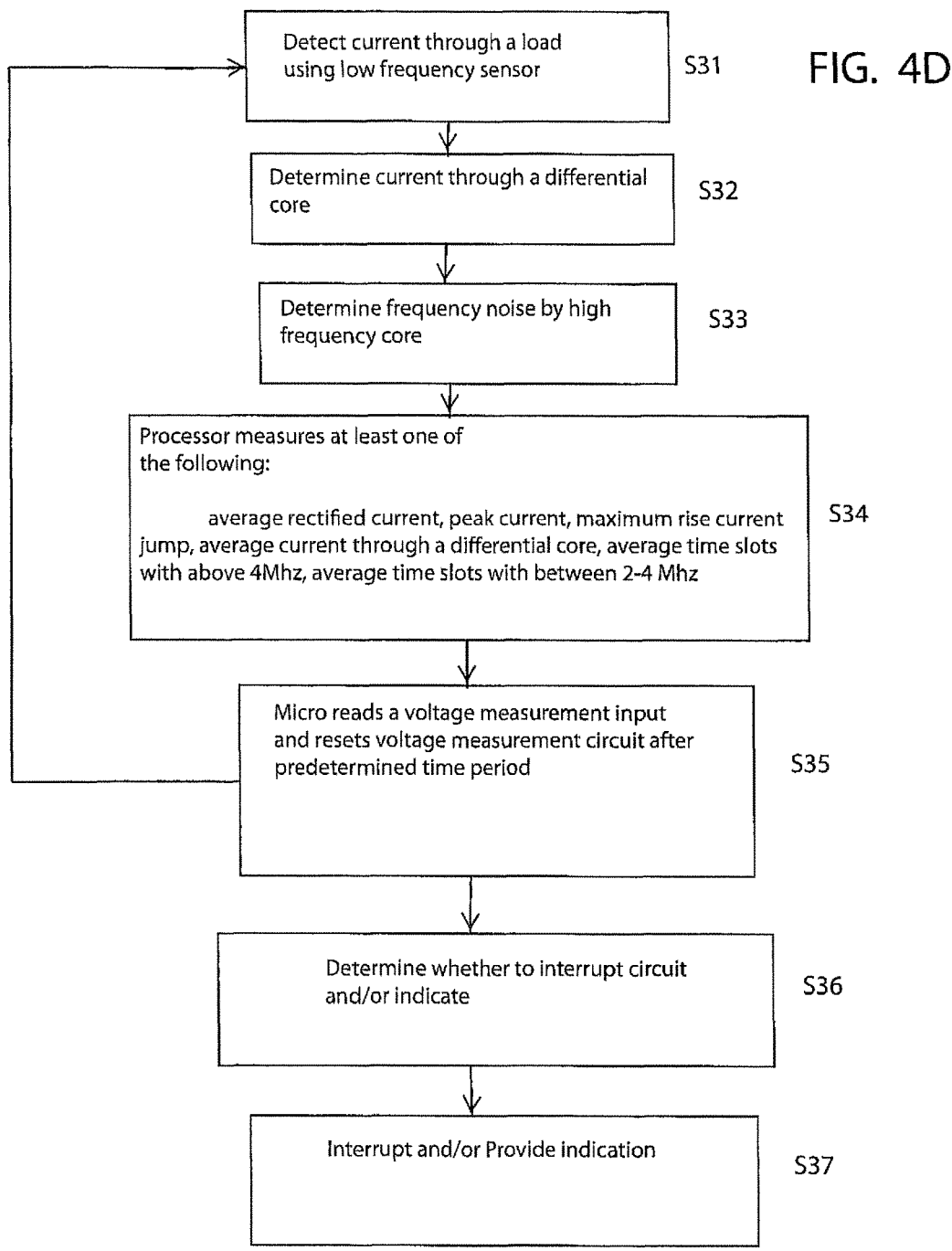
FIG. 4D is a simplified flow chart of an embodiment of the process performed by the AFCI system.

FIG. 4D is a simplified series of steps for determining an arc. While these steps are listed sequentially, many of these steps could be conducted simultaneously as well. For example, after powering on and setting a series of time periods such as set forth in step S1, processor 100 could, in step S31 determine or detect a current through a load using a low frequency sensor such as sensor 24. In step S32, processor could determine a differential current through a reading from differential core 26. Next, in step S33 processor 100 could determine frequency noise using high frequency core 22. Next, processor 100 could measure the following line characteristics average rectified current, peak current, maximum rise current jump, average current through a differential core, average time slots with 4 Mhz or above or average time slots with between 2-4 Mhz.

Next, in step S35, processor 100 could then read or determine a voltage measurement input and then reset a voltage measurement circuit such as circuit 130 after a predetermined time period. Next, based upon the characteristics read by processor 100, in steps S34, and S35, processor 100 in step S36 can determine whether to interrupt a circuit or indicate the presence of an arc fault by comparing the characteristics read by the processor to a predetermined set of characteristics stored in memory by the processor. Next, in step S37, processor 100 can then either interrupt the circuit by sending a signal to SCR 61.1 or to indicate the presence of an arc fault as indicated in any one of steps 17b-17d or steps 26b-26d.

FIGS. 5A-5F show graphically the different electrical line characteristics that are processed by processor 100, such as frequency, current, differential current, and voltage, as well as a graphical representation of different calculations that can be recorded by processor 100 such as in the form of a shift register.

Figure 5A:
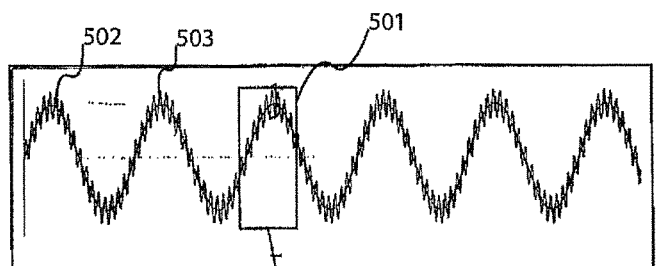
FIG. 5A is a graphical depiction of an electrical signal on a line.

For example, FIG. 5A is a graphical view of a line signal on a line which can be read by a processor or arc fault circuit interrupter such as any one of arc fault circuits 6, 6.1, or 6.2. For example as shown in FIG. 5A there is a processor half cycle 501 which includes a carrier wave 502 and a frequency or signal wave 503. Carrier wave can, under normal operating conditions have a frequency of, or at least approximately 60 Hz. Signal wave 503 can comprise a different frequency, which can be of a higher frequency and may be characterized as noise. A time period such as a measurement or second time period could be used to read or determine the characteristics of this signal wave.

Figure 5B:
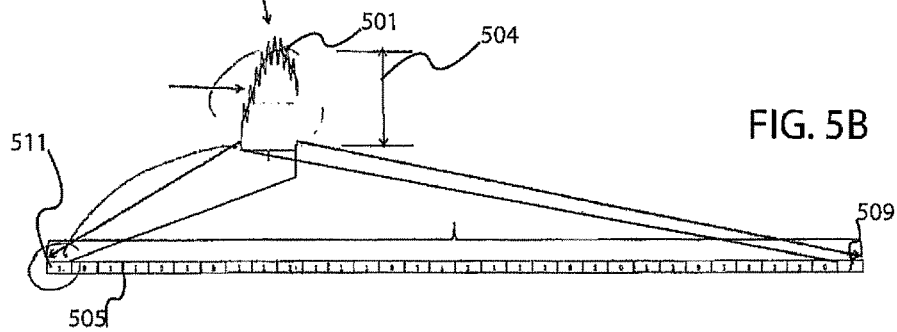
FIG. 5B is a graphical depiction of a reading and calculation of values obtained from the electrical signal on the line with this reading being performed across at least two time periods.

While FIG. 5A shows a series of consecutive half cycles such as a processor half cycle, FIG. 5B shows a single processor half cycle 501 which as described above, does not necessarily start at a zero crossing. As described above, for each reading of a processor half cycle 501, an AC current is determined, as indicated by amplitude reading 504, and a recorded bit is inserted into a shift register such as shift register 505. Shift register 505, can then be stored on a memory incorporated within processor 100. Thus, in at least one embodiment processor 100 includes a memory storage device incorporated therein. Alternatively, in another embodiment, a memory can be included in the circuit interrupter but disposed outside of a processor such as processor 100. Shift register 505 can extend across multiple processor half cycles such as 120 processor half cycles and can include multiple recorded bits such as a recently recorded bit 509 and a last recorded bit 511. When a recently recorded bit 509 is inserted into a shift register, then a last recorded bit 511 drops off.

Figure 5C:
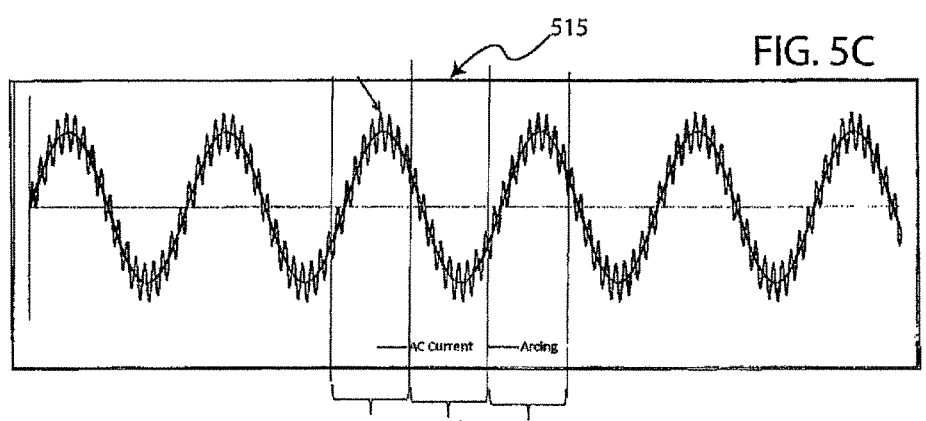
FIG. 5C is a graphical depiction of multiple time period of FIG. 5B.
Figure 5D:
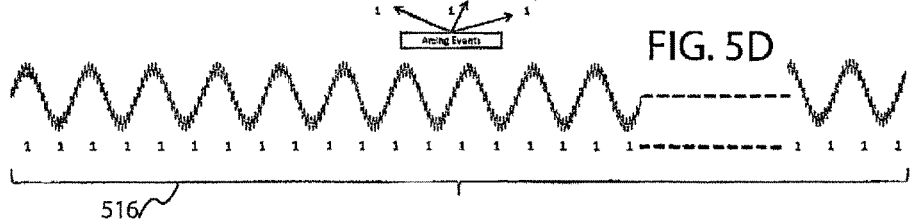
FIG. 5D is a graphical depiction of a first duration of recording time period for determining an arc.
Figure 5E:
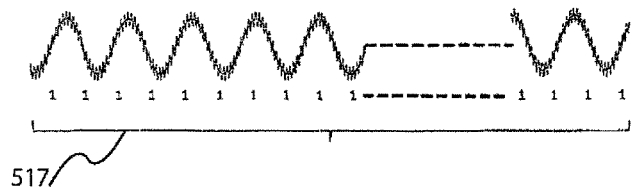
FIG. 5E is a graphical depiction of a second duration of recording time period for determining an arc.
Figure 5F:
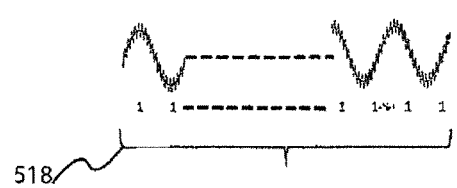
FIG. 5F is a graphical depiction of a third duration of recording time period for determining an arc.

FIG. 5C also shows that across a third time period or an arcing window, multiple processor half cycles can be read or analyzed to determine the presence of an arc during a third time period or arcing window. For example, FIG. 5D shows a first type of arcing window 516 which is based upon a predetermined time period such as 1 second. FIG. 5E shows a second type of arcing window 517 which is based upon a second predetermined time period, while FIG. 5F shows a third type of time period based upon another predetermined time period. For example, in a preferred embodiment the predetermined time period for arcing window 516 could be 1 second based upon a current reading such as reading 504 of less than 5 A. A predetermined time period for arcing window 517 could be 400 ms which could be based upon a current reading such as amplitude reading 504 of greater than or equal to 5 A but less than 10 A. A predetermined time period for arcing window 518 could be 200 ms which could be based upon a current reading of over 10 A.

Once processor 100 determines that there is an arcing fault, it would preferably send an interrupt signal to disconnect line side 11 from load side 70 (including downstream load and face load on receptacle), thereby cutting power between conductive paths 16 and 18 on the line side and load conductive paths 17 and 19. Processor 100 is configured to cause interrupting mechanism 60 to disconnect the line side from the load side.

Generally, interrupting mechanism 60 may include a coil or solenoid 63, a plunger 65, an actuator circuit 61, and any other additional elements or devices known in the art which may be configured to selectively interrupt electrical current on conductive paths 16 and 18 and selectively isolate power preferably between line side 11, load side 70 and a set of face contacts such as those used for receiving a plug.

Alternatively, interrupting mechanism 60 may be arranged and configured to isolate selective conductive paths; e.g., line side 11 from load side 70, or line side 11 from a set of face contacts, etc.

In at least one embodiment, there are first, second, and third electrical conductors where the first, second and third electrical conductors may be: (i) selectively isolated from each other and (ii) selectively connected to each other. Interrupting mechanism 60 is arranged and configured to selectively isolate the first, second and third electrical conductors from each other. Likewise, interrupting mechanism 60 may also be arranged and configured to selectively connect the first, second and third electrical conductors to each other.

Actuator circuit 61 may include SCR 61.1, resistor R19, resistor R12 and capacitor C2. Resistor R12 and capacitor C2 are used in one preferred embodiment and act as a filter circuit to prevent false triggering of SCR 61.1. In addition, resistor R23 and capacitor C9 may be employed to act as a snubber circuit in order to reduce the noise in the circuitry to improve the triggering/firing capability and reliability of SCR 61.1. Alternatively, a TVS circuit SI1 can be electrically coupled between the coil 63 of actuator 60 and SCR 61.1. Use of such a snubber circuit in certain preferred embodiments would be to improve the reliability of SCR 61.1. The snubber circuitry shown in FIG. 3A preferably minimizes overvoltage stress on the AFCI components/elements in the event of power line surges. Alternatively, to reduce overvoltage in the event of a surge, one or more bi-directional TVS diodes can be used in place of, or in addition to, RC snubber circuitry (see e.g., FIG. 3C).

Advantageously, the combination of the TVS diodes and the trip coil inductance in the arrangement/configuration shown permits the trip coil to behave as a current limiting component for the TVS diodes. Such a configuration could help to reliably protect the AFCI components against surges and further does not exhibit some or all of the acoustic noises that may be associated with the RC snubber circuitry discussed above. To withstand abnormal overvoltage conditions, e.g., when input voltage jumps to double the normal power line voltage, the TVS circuitry should be designed/configured to withstand a 350V-400V nominal voltage range. One possible example of a TVS circuit/design is the commercially available SMBJ350CA offered by Littlefuse.

An SCR signal, denoted SCR, may be output by processor 100 from, e.g., pin P7 to selectively activate SCR 61.1. Actuation of SCR 61.1 causes coil 63 to be energized, resulting in movement of plunger 65 to selectively open contacts 62.

Figure 6A:
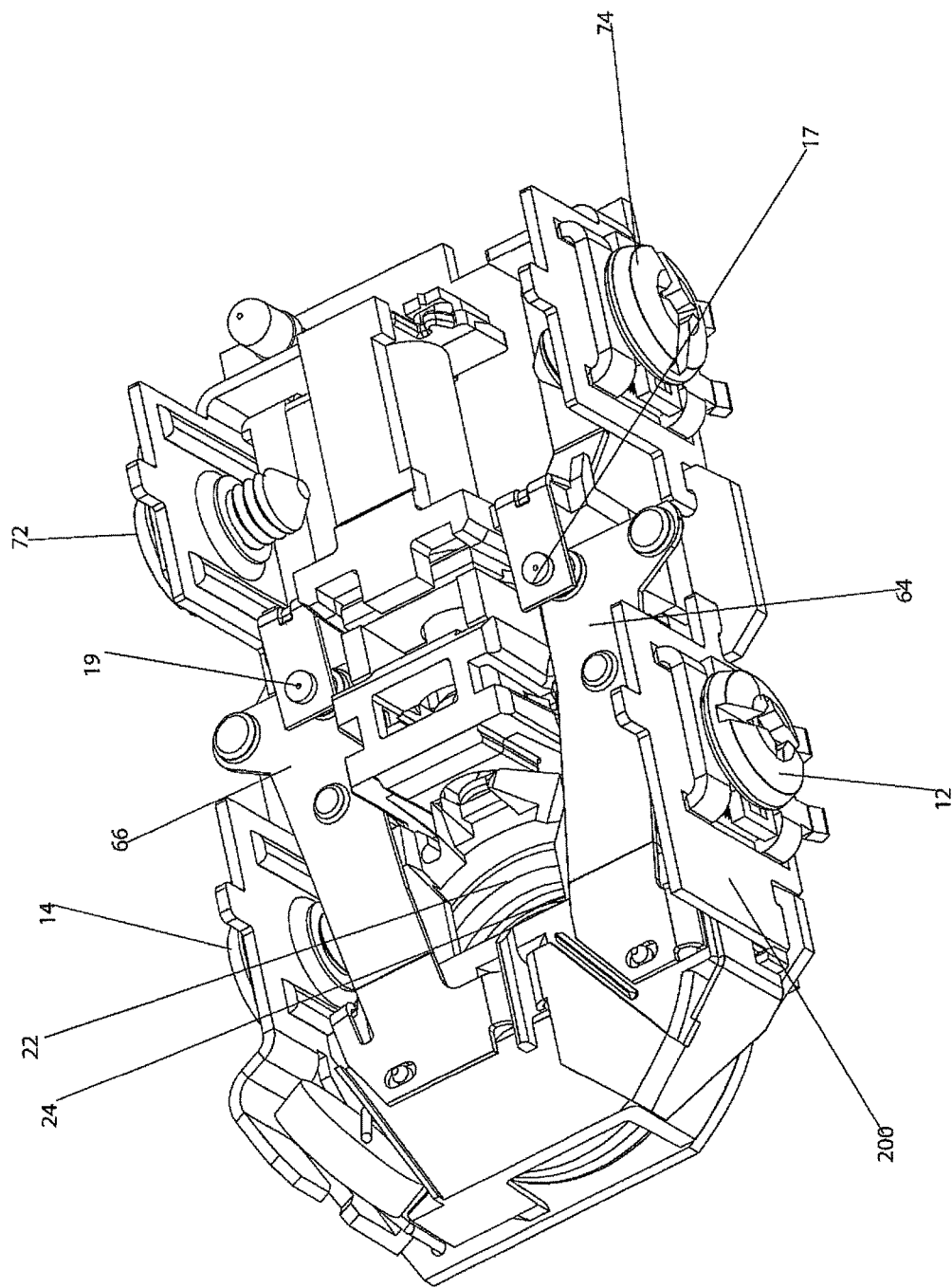
FIG. 6A is a perspective view of one embodiment of a component layout for the AFCI system.
Figure 6B:
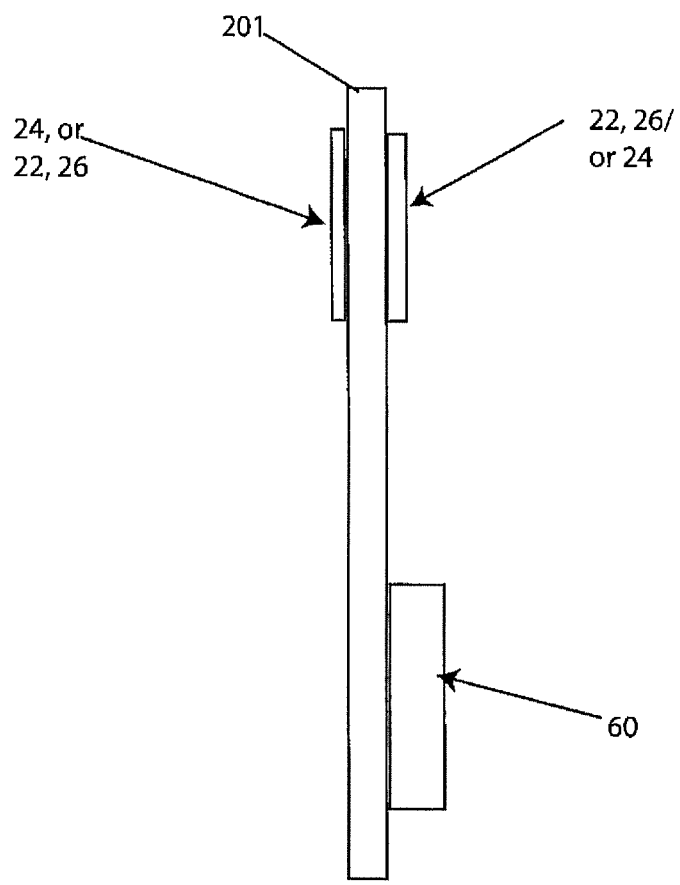
FIG. 6B is a side view of one embodiment of a component layout of the sensors with respect to a circuit board.

FIG. 6A is a perspective view of one representative embodiment of the AFCI circuitry in accordance with certain teachings of the present inventive features, shown in one or more of FIGS. 1A-H and 3A-3F. FIG. 7 shows housing 200, which is configured to house the AFCI circuitry, e.g., any one of the disclosed circuits 6, 6.1, or 6.2. AFCI circuitry includes but is not necessarily limited to sensors or transformers 22, 24, and 26, line terminals 12 and 14, separable contacts 64 and 66, line side conductive paths 16 and 18 (not shown in this view), load side conductive paths 17 and 19, and load terminals 72 and 74. FIGS. 6A and 6B illustrate that in certain preferred embodiments of the invention the AFCI circuitry can be configured in a space saving manner allowing installation in a single gang enclosure, such as a single gang wall box/junction box, to create an in-line/branch circuit AFCI device.

While the sensors and the circuitry can be configured in any usable way on a circuit board, FIG. 6B illustrates a side view of one possible configuration for a circuit board layout of any one of circuits 5, 6, 6.1, or 6.2. For example, the side view of circuit board 201 may preferably be configured to support, or be coupled to, much or all of the circuitry shown in FIGS. 1A-3F. As shown in this view, there is disclosed a three sensor configuration, with two sensors being arranged on a first side and one other sensor being arranged on the opposite side. In certain preferred embodiments, differential transformer 26 may be nested inside of the inner perimeter of high frequency transformer 22 and low frequency current transformer 24 may be disposed on the opposite side of circuit board 201. Any one of the sensors may be partially disposed within the thickness of board 201 rather than on either side as well. However, it should be readily understood that other configurations can also be used, such as those shown in FIGS. 1A-1H. Advantageously, because stacking two or more sensors on top of each other may potentially require shielding resulting in the need for a larger housing, one or more sensors can be arranged on opposite sides of the circuit board in order to save space.

FIG. 7 shows the AFCI system with a front face 220 forming a part of housing 200. Front face 220 has openings 222 and 224, which are each configured to receive a plug. Disposed inside of housing 200 are face contacts/terminals, which are configured to provide power to plugs that are inserted into openings 222 and/or 224. In addition, buttons 225 and 226 are included, wherein at least one button 225 or 226 is arranged and configured to actuate test switch 112 inside of housing 200, so that when this button is pressed, a test sequence as described above is activated. The other button, 225 or 226, can be used to either trip or reset the contacts, either in conjunction with a test or not.

Accordingly, while a few embodiments of the present invention have been shown and described, it is to be understood that many changes and modifications may be made thereunto without departing from the spirit and scope of the invention as defined in the appended claims. In addition, it is to be understood that any values provided above or configurations discussed above or shown in the drawings are only provided for purposes of providing an example for the invention and are not provided for purposes of limiting the scope of any one of the claims unless expressed in writing in those claims.

What is claimed is:

1. A circuit interrupter, comprising:
a first conductive path and a second conductive path;
a first arc fault detection circuit including a low frequency sensor, wherein the first conductive path passes through the low frequency sensor, the low frequency sensor including a first coil;
a second arc fault detection circuit including a high frequency sensor wherein the first and second conductive paths pass through the high frequency sensor and the high frequency sensor is configured to sense a difference in magnitude of currents respectively flowing in the first and second conductive paths, the high frequency sensor including a second coil and a third coil; and
a test block configured to perform a test of the high frequency sensor, the test block including:
a current supply configured to provide flow of a test current through the third coil;
a measuring circuit configured to measure a current flowing through the second coil;
logic configured to determine, based on the current flowing through the second coil, that the test current was detected by the second coil; and
an indicator configured to indicate a result of the test.

2. The circuit interrupter of claim 1, wherein the low frequency sensor further comprises a fourth coil, wherein the test current is a first test current, and the current supply is further configured to provide flow of a second test current through the fourth coil.

3. The circuit interrupter of claim 1, wherein the low frequency sensor is co-axially aligned with the high frequency sensor along at least one conductor.

4. The circuit interrupter of claim 1, wherein one of the second coil and the third coil is disposed within and substantially concentric with the other of the second coil and the third coil.

5. The circuit interrupter of claim 1, wherein one of the second coil and the third coil include windings traversely wound around a substantially annular air core, and the other of the second coil and the third coil is disposed within the air core.

6. The circuit interrupter of claim 5, wherein the second coil includes windings traversely wound around the air core, and the second coil is configured to sense arcing signals within a frequency range of 1 megahertz (MHz) to 10 MHz.

7. The circuit interrupter of claim 5, wherein the low frequency sensor is configured to sense arcing signals at a power line frequency.

8. The circuit interrupter of claim 5, wherein the air core further comprises a dielectric support member, and the dielectric support member is configured to provide electrical isolation between the second coil and the third coil.

9. The circuit interrupter of claim 1, wherein the test is initiated by a processor in the circuit interrupter.

10. The circuit interrupter of claim 1, wherein the test is periodically initiated by a processor in the circuit interrupter.

11. The circuit interrupter of claim 1, wherein the test is initiated external to a processor in the circuit interrupter.

12. A circuit interrupter, comprising:
a first arc fault detection circuit including a first coil and a second coil;
a second arc fault detection circuit including a third coil and a fourth coil; and
a test block configured to perform a test of the first arc fault detection circuit and the second arc fault detection circuit, the test block including:
a current supply configured to provide flow of a first test current through the first coil and a flow of a second test current through the fourth coil;

a measuring circuit configured to measure a current flowing through the second coil and a current flowing through the third coil;

logic configured to determine, based on the current flowing through the second coil and the current flowing through the third coil, that conditions satisfying criteria related to an arc fault exist; and an indicator configured to indicate a result of the test.

13. The circuit interrupter of claim 12, wherein the third coil is co-axially aligned with the second coil along at least one conductor.

14. The circuit interrupter of claim 12, wherein one of the second coil and the third coil include windings traversely wound around a substantially annular air core, and the other of the second coil and the third coil is disposed within the air core.

15. The circuit interrupter of claim 12, wherein the test is initiated by a processor in the circuit interrupter.

16. The circuit interrupter of claim 12, wherein the test is initiated external to a processor in the circuit interrupter.

17. A circuit interrupter, comprising:
a first arc fault detection circuit including a first coil and a second coil;
a second arc fault detection circuit including a third coil; and
a test block configured to perform a test of the first arc fault detection circuit and the second arc fault detection circuit, the test block including:
a current supply configured to provide flow of a test current through the first coil;
a measuring circuit configured to measure a current flowing through the second coil and a current flowing through the third coil;
logic configured to determine, based on the current flowing through the second coil and the current flowing through the third coil, that conditions satisfying criteria related to an arc fault exist; and
an indicator configured to indicate a result of the test,
wherein one of the second coil and the third coil is disposed within and substantially concentric with the other of the second coil and the third coil.

18. The circuit interrupter of claim 17, wherein the third coil is co-axially aligned with the second coil along at least one conductor.

19. The circuit interrupter of claim 17, wherein one of the second coil and the third coil include windings traversely wound around a substantially annular air core, and the other of the second coil and the third coil is disposed within the air core.

20. The circuit interrupter of claim 17, wherein the test is initiated by a processor in the circuit interrupter.

21. The circuit interrupter of claim 17, wherein the test is initiated external to a processor in the circuit interrupter.

* * * * *